US012622252B2

(12) United States Patent
Chu et al.

(10) Patent No.: US 12,622,252 B2
(45) Date of Patent: May 5, 2026

(54) BACKSIDE CONTACTS FOR SOURCE/DRAIN REGIONS

(71) Applicant: International Business Machines Corporation, Armonk, NY (US)

(72) Inventors: Albert M. Chu, Nashua, NH (US); Junli Wang, Slingerlands, NY (US); Brent A. Anderson, Jericho, VT (US); Leon Sigal, Monsey, NY (US); David Wolpert, Poughkeepsie, NY (US); Ruilong Xie, Niskayuna, NY (US); Jay William Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 18/141,552

(22) Filed: May 1, 2023

(65) Prior Publication Data

US 2024/0371728 A1     Nov. 7, 2024

(51) Int. Cl.
H10D 84/00     (2025.01)
H10D 30/01     (2025.01)
(Continued)

(52) U.S. Cl.
CPC .......... H10W 20/20 (2026.01); H10D 30/014 (2025.01); H10D 30/43 (2025.01);
(Continued)

(58) Field of Classification Search
CPC ...... H10D 84/83; H10D 84/85; H10D 84/851; H10D 84/0149; H10D 84/0165; H10D 84/017
See application file for complete search history.

(56) References Cited

U.S. PATENT DOCUMENTS 11,171,138 B2     11/2021   Huang et al.
11,282,861 B2     3/2022    Nelson et al.
(Continued)

FOREIGN PATENT DOCUMENTS

EP          3629368 A2     4/2020
KR     2021-0148892 A     12/2021
(Continued)

OTHER PUBLICATIONS

PCT/IB2024/053283, International Search Report & Written Opinion, Jul. 10, 2024, 13 pages.
Intellectual Property Office, "Request for the Submission of an Opinion," Nov. 28, 2025, 22 Pages, KR Application Number—10-2025-7026216.

*Primary Examiner* — Reema Patel
(74) *Attorney, Agent, or Firm* — Kimberly Zillig; Ryan, Mason & Lewis, LLP

(57)          ABSTRACT

A semiconductor structure comprises a first transistor and a second transistor. The first transistor comprises a first input source/drain region and a first output source/drain region, and the second transistor comprises a second input source/drain region and a second output source/drain region. The first input source/drain region and the second input source/drain region are connected to a first source/drain contact, and the first output source/drain region and the second output source/drain region are connected to a second source/drain contact. The first source/drain contact and the second source/drain contact on a same side of the semiconductor structure.

18 Claims, 32 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10W 20/20* | (2026.01) |

(52) U.S. Cl.

CPC ..... *H10D 30/6729* (2025.01); *H10D 30/6735* (2025.01); *H10D 30/6757* (2025.01); *H10D 62/121* (2025.01); *H10D 64/017* (2025.01); *H10D 84/017* (2025.01); *H10D 84/0186* (2025.01); *H10D 84/038* (2025.01); *H10D 84/85* (2025.01)

(56) References Cited

U.S. PATENT DOCUMENTS

| | | | |
|---|---|---|---|
| 11,431,339 B1 * | 8/2022 | Ma | H03K 19/018521 |
| 11,552,084 B2 | 1/2023 | Wang et al. | |
| 2022/0122970 A1 | 4/2022 | Do et al. | |
| 2022/0130759 A1 | 4/2022 | Huang et al. | |
| 2022/0173090 A1 | 6/2022 | Gomes et al. | |
| 2022/0181259 A1 | 6/2022 | Chiang et al. | |
| 2022/0208757 A1 | 6/2022 | Do et al. | |
| 2022/0238442 A1 | 7/2022 | Sio et al. | |

FOREIGN PATENT DOCUMENTS

| | | | |
|---|---|---|---|
| KR | 10-2022-0056089 A | 5/2022 | |
| KR | 10-2022-0151109 A | 11/2022 | |

* cited by examiner

Power Gating

Vdd

Enable_N

BSPDN

Vdd_core

Gated logic

10

OUT signal to backside

Vdd

IN

OUT

Vss

14

Enable_N

DBC

CA2

RX

DBC

CA1 PC

P

P

Vdd
BSMx

Vdd_core
BSMx

RX

12

IN

DBC

RX

CA1'

DBC

RX

CA2'

PC

DBC

P

P

N

Vdd
BSMx

OUT
BSMx

Vss
BSMx

RX

16

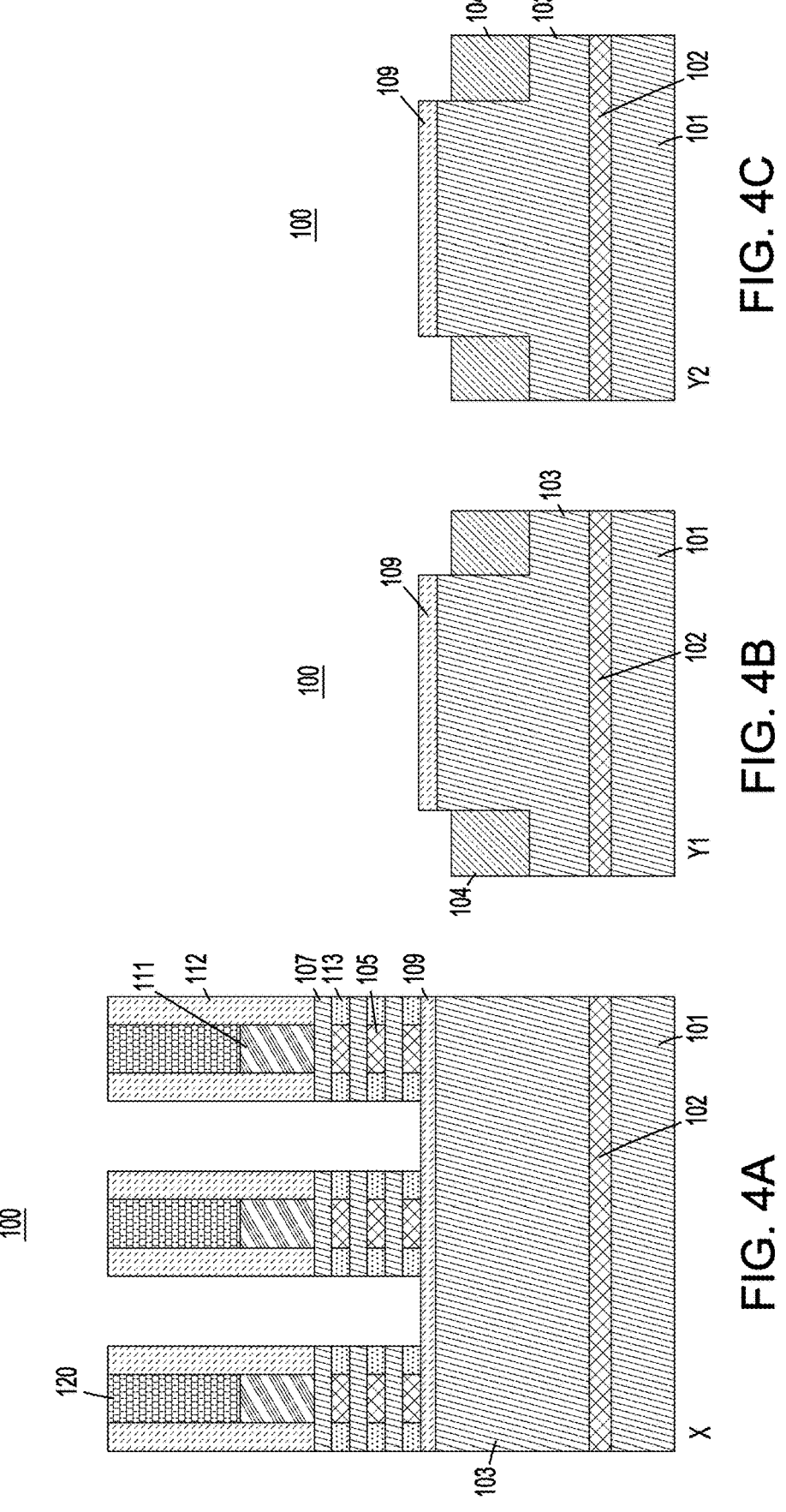

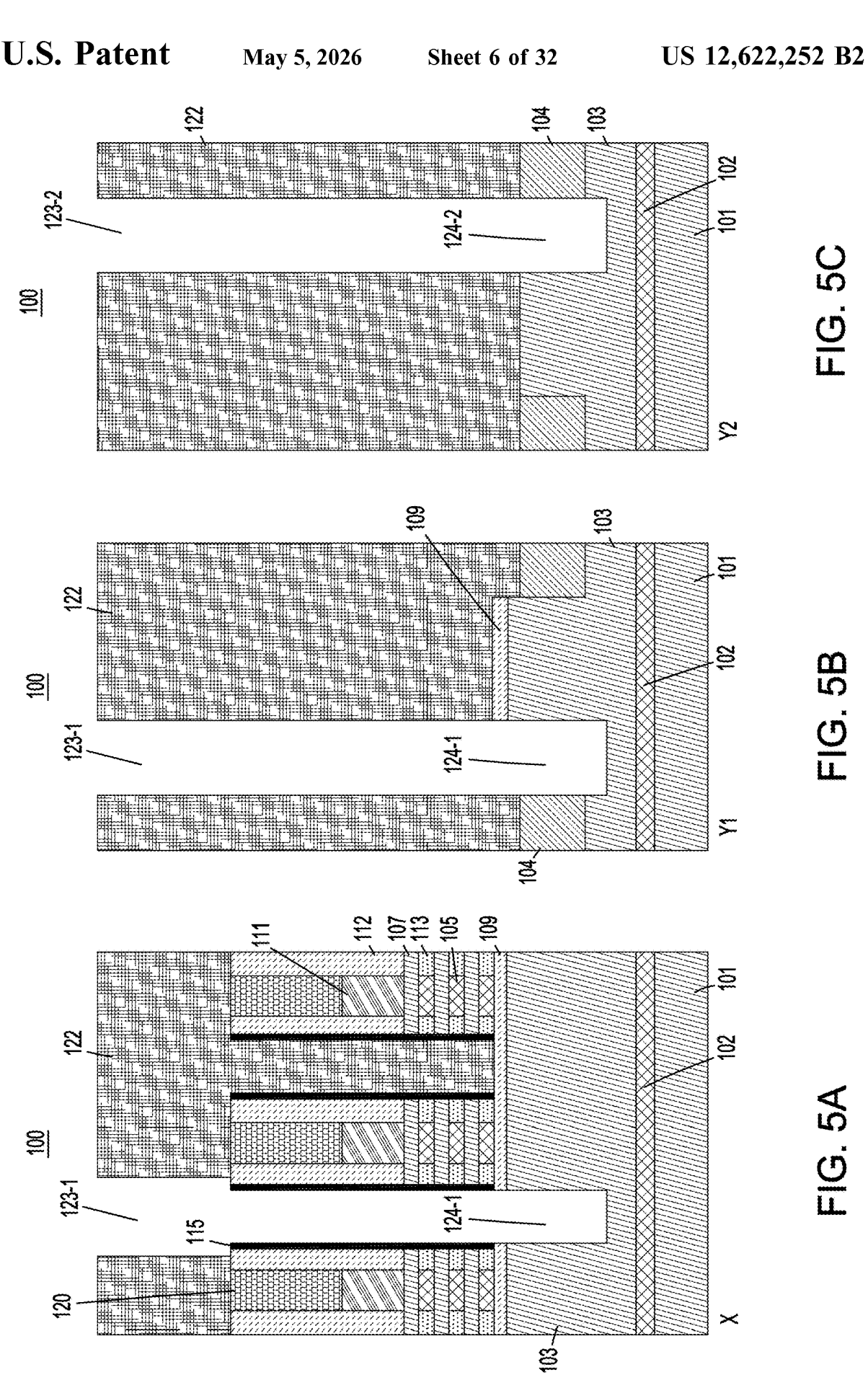

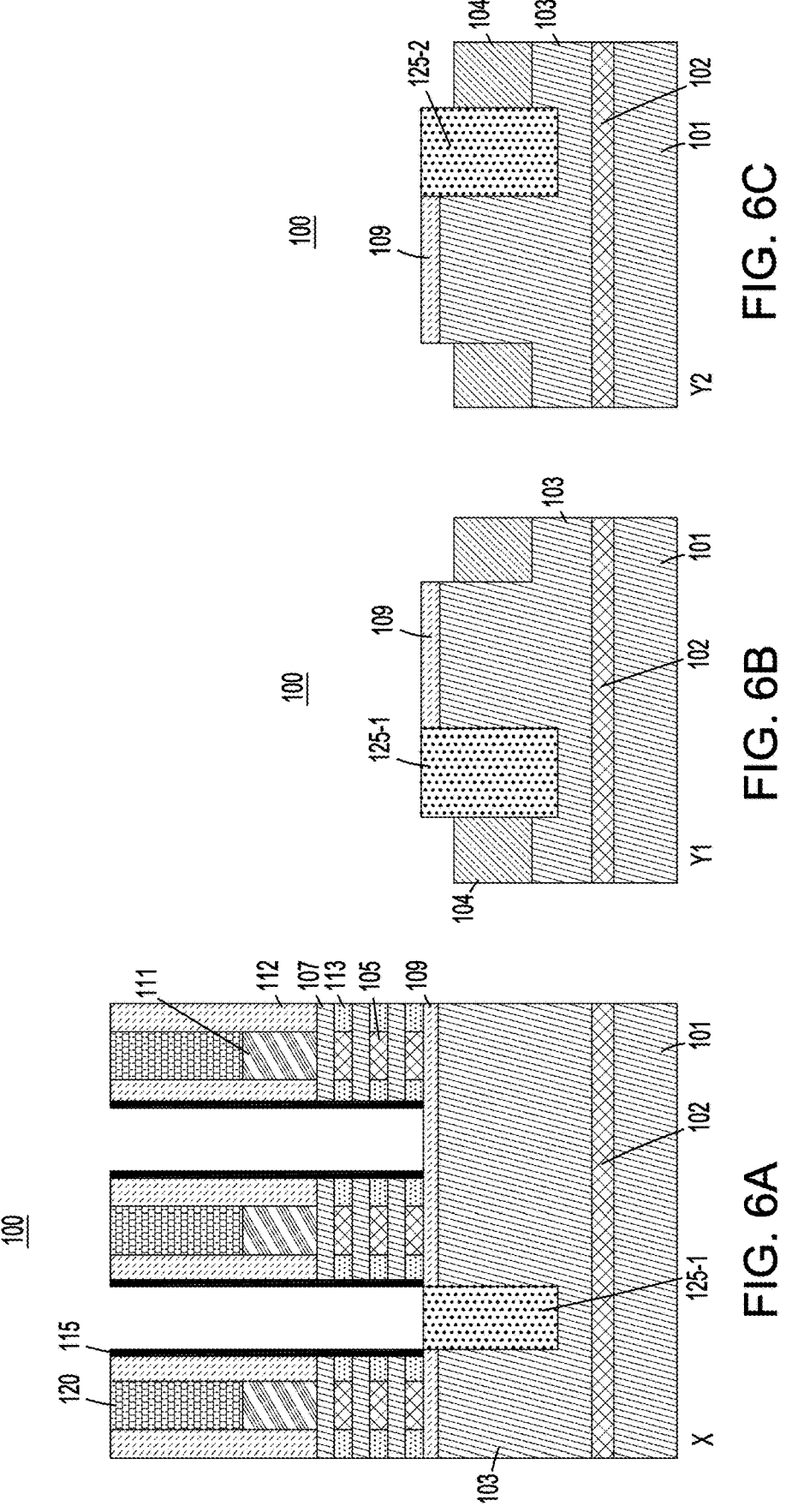

1

BACKSIDE CONTACTS FOR SOURCE/DRAIN REGIONS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

With conventional approaches, connections to source/drain regions of FETs from backside power rails are typically made by through vias from the backside to the frontside of a semiconductor device. As a result, the semiconductor manufacturing processes are undesirably complex. In addition, the resulting structures impede size reductions and further miniaturization due to the need to accommodate the through vias.

SUMMARY

Embodiments of the invention provide techniques for forming efficient connections to backside power sources by using direct backside contacts.

In one embodiment, a semiconductor structure comprises a first transistor and a second transistor. The first transistor comprises a first input source/drain region and a first output source/drain region, and the second transistor comprises a second input source/drain region and a second output source/drain region. The first input source/drain region and the second input source/drain region are connected to a first source/drain contact, and the first output source/drain region and the second output source/drain region are connected to a second source/drain contact. The first source/drain contact and the second source/drain contact on the same side of the semiconductor structure.

As may be combined with the preceding paragraph, the same side of the semiconductor structure may comprise the backside of the semiconductor structure. The first source/drain contact and the second source/drain contact may be respectively connected to a first wire and a second wire disposed on the backside of the semiconductor structure. At least one edge of the first source/drain contact may be self-aligned with at least one edge of the first input source/drain region, and at least one edge of the second source/drain contact may be self-aligned with at least one edge of the second output source/drain region. The first wire may contact the first source/drain contact, and the second wire may contact the second source/drain contact.

As may be combined with the preceding paragraphs, the semiconductor structure may further comprise at least one gate structure common to the first transistor and the second transistor. The first transistor and the second transistor may have the same doping type. The semiconductor structure may further comprise a third transistor adjacent the second transistor. The third transistor may have a different doping type than that of the first transistor and the second transistor.

Advantageously, the semiconductor structure includes efficient connections to backside power sources through direct backside contacts. For example, input source/drain regions of multiple transistors are commonly connected to a direct backside contact and output source/drain regions of multiple transistors are commonly connected to another direct backside contact. The backside contacts are connected to backside power rails and may be self-aligned with edges of the input and output source/drain regions. The transistors may comprise common gate structures, and have the same doping type. As an additional advantage, a backside source/drain contact may be formed on part of a surface or an entire surface of a source/drain region. In the case where the backside source/drain contact is formed on an entire surface of a source/drain region, a via may be formed between the backside source/drain contact and a backside power rail.

In another embodiment, a semiconductor structure comprises a plurality of input source/drain regions connected to a first wire through a first contact, and a plurality of output source/drain regions connected to a second wire through a second contact. The first wire and the second wire are on the same side of the semiconductor structure.

As may be combined with the preceding paragraphs, the same side of the semiconductor structure may comprise the backside of the semiconductor structure. The first contact and the second contact may be on the backside of the semiconductor structure. The plurality of input source/drain regions and the plurality of output source/drain regions may correspond to a merged transistor, wherein the merged transistor comprises a first transistor and a second transistor. The same side of the semiconductor structure may comprise a backside of the first transistor and of the second transistor. The semiconductor structure may comprise a third transistor adjacent the merged transistor and at least one gate structure common to the merged transistor and the third transistor. The first transistor and the second transistor may have the same doping type. The third transistor may have a different doping type than that of the first transistor and the second transistor.

In another embodiment, a semiconductor structure comprises a first input source/drain region and a first output source/drain region, and a second input source/drain region and a second output source/drain region. The first input source/drain region and the second input source/drain region are connected to a first source/drain contact. The first output source/drain region and the second output source/drain region are connected to a second source/drain contact. The first source/drain contact is connected to a first wire through a first via and the second source/drain contact is connected to a second wire through a second via. The first source/drain contact, the second source/drain contact, the first wire and the second wire are on the same side of the semiconductor structure.

As may be combined with the preceding paragraphs, the same side of the semiconductor structure may comprise the backside of the semiconductor structure. The first input source/drain region and the first output source/drain region may correspond to a first transistor, and the second input source/drain region and the second output source/drain region may correspond to a second transistor. The first transistor and the second transistor may gate a voltage input for a core power supply.

In another embodiment, a semiconductor structure comprises a plurality of transistors comprising a first transistor, a second transistor adjacent the first transistor and a third transistor adjacent the second transistor. The first transistor and the second transistor have the same doping type, and the third transistor has a different doping type than that of the first transistor and the second transistor. The semiconductor structure further comprises at least one gate structure common to the first transistor, the second transistor and the third transistor. A first input source/drain region and a first output source/drain region correspond to the first transistor, and a second input source/drain region and a second output source/drain region correspond to the second transistor. The first input source/drain region and the second input source/drain region are connected to a first source/drain contact. The first output source/drain region and the second output source/drain region are connected to a second source/drain contact.

As may be combined with the preceding paragraphs, the first source/drain contact and the second source/drain contact may be disposed on a backside of the plurality of transistors and may be respectively connected to a first wire and a second wire disposed on the backside of the plurality of transistors. At least one edge of the first source/drain contact may be self-aligned with at least one edge of the first input source/drain region, and at least one edge of the second source/drain contact may be self-aligned with at least one edge of the second output source/drain region. The first wire may contact the first source/drain contact, and the second wire may contact the second source/drain contact.

In another embodiment, a method comprises forming a first sacrificial layer and a second sacrificial layer in a semiconductor layer, and forming a plurality of first source/drain regions and a plurality of second source/drain regions on the semiconductor layer. At least one first source/drain region of the plurality of first source/drain regions is formed on the first sacrificial layer, and at least one second source/drain region of the plurality of second source/drain regions is formed on the second sacrificial layer. The first sacrificial layer is replaced with a first contact and the second sacrificial layer is replaced with a second contact. The method further includes forming a first wire on the first contact and a second wire on the second contact. The first wire and the second wire are on the same side of the plurality of first and second source/drain regions as the first and second contacts.

As may be combined with the preceding paragraphs, the method may further comprise connecting the first and second wires to a backside power delivery network. At least one edge of the first contact may be self-aligned with at least one edge of the at least one first source/drain region, and at least one edge of the second contact may be self-aligned with at least one edge of the at least one second source/drain region.

These and other features and advantages of embodiments described herein will become more apparent from the accompanying drawings and the following detailed description.

BRIEF DESCRIPTION OF THE DRAWINGS

FIG. 4A depicts a first cross-sectional view corresponding to the line X in FIG. 3 following inner spacer formation, according to an embodiment of the invention.

FIG. 4B depicts a second cross-sectional view corresponding to the line Y1 in FIG. 3 following inner spacer formation, according to an embodiment of the invention.

FIG. 4C depicts a third cross-sectional view corresponding to the line Y2 in FIG. 3 following inner spacer formation, according to an embodiment of the invention.

FIG. 5A depicts a first cross-sectional view corresponding to the line X in FIG. 3 following protective spacer formation and patterning for backside contacts, according to an embodiment of the invention.

FIG. 5B depicts a second cross-sectional view corresponding to the line Y1 in FIG. 3 following protective spacer formation and patterning for backside contacts, according to an embodiment of the invention.

FIG. 5C depicts a third cross-sectional view corresponding to the line Y2 in FIG. 3 following protective spacer formation and patterning for backside contacts, according to an embodiment of the invention.

FIG. 6A depicts a first cross-sectional view corresponding to the line X in FIG. 3 following organic planarization layer (OPL) removal and sacrificial layer formation, according to an embodiment of the invention.

FIG. 6B depicts a second cross-sectional view corresponding to the line Y1 in FIG. 3 following OPL removal and sacrificial layer formation, according to an embodiment of the invention.

FIG. 6C depicts a third cross-sectional view corresponding to the line Y2 in FIG. 3 following OPL removal and sacrificial layer formation, according to an embodiment of the invention.

DETAILED DESCRIPTION

Illustrative embodiments of the invention may be described herein in the context of illustrative methods for forming direct backside contact structures to input and output source/drain regions of transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Figures 1A, 1B, 1C, 1D:
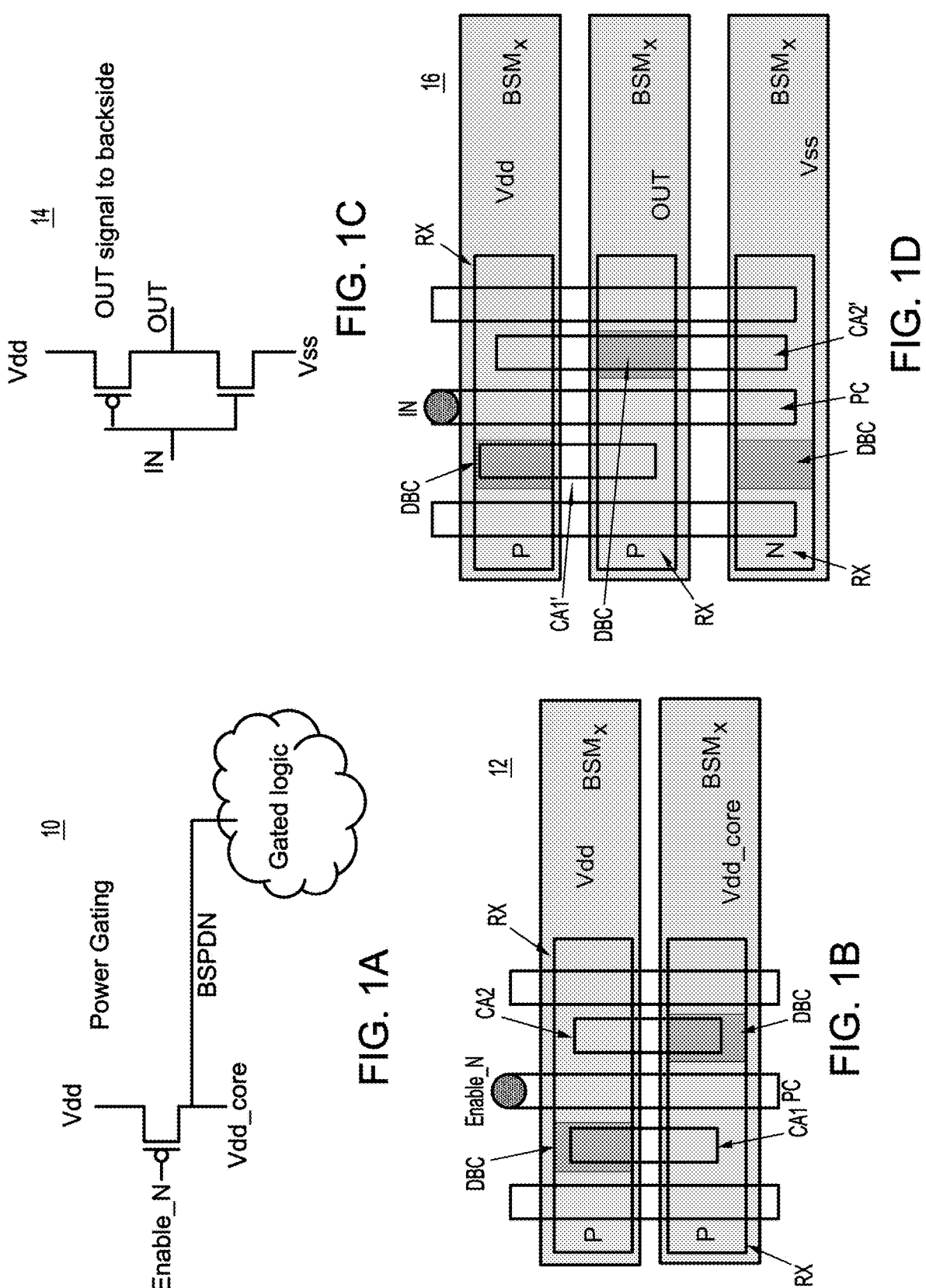
FIG. 1A depicts a circuit diagram illustrating a transistor structure with backside power distribution, according to an embodiment of the invention.
FIG. 1B depicts a top view of a transistor structure in accordance with the circuit diagram of FIG. 1A, with source/drain regions of adjacent transistors connected to common backside contacts, according to an embodiment of the invention.
FIG. 1C depicts a circuit diagram illustrating a transistor structure with an output signal to a backside, according to an embodiment of the invention.
FIG. 1D depicts a top view of a transistor structure corresponding to the circuit diagram of FIG. 1C with source/drain regions of adjacent transistors connected to common backside contacts, according to an embodiment of the invention.

FIG. 1A depicts a circuit diagram 10 illustrating a transistor structure with backside power distribution, and FIG. 1B depicts a top view of a transistor structure 12 in accordance with the circuit diagram 10, with source/drain regions of adjacent transistors connected to common backside contacts DBC. Referring to the circuit diagram 10, in a power gating circuit, where a supply voltage (Vdd) input is gated for a local core power supply, a gate receives an enable signal (Enable_N). Supply voltage may also be referred to herein as a "drain voltage." An input source/drain region of the transistor receives a supply voltage (Vdd) and an output source/drain region corresponds to a local core power supply voltage (Vdd_core), which is supplied to gated logic through a backside power delivery network (BSPDN).

Referring to FIG. 1B, the transistor structure 12 includes two p-type transistors, each comprising an active area (RX). Alternatively, the transistor structure 12 includes two n-type transistors. In either case, the two transistors have the same doping type. According to an embodiment, input source/drain regions of each transistor are connected to the supply voltage (Vdd) through a direct backside contact (DBC) to a conductive wire (e.g., metal wire). The input source/drain region may optionally be connected to a frontside contact portion (CA1). Similarly, output source/drain regions of each transistor are connected to a core power supply voltage (Vdd_core) through another direct backside contact (DBC) to another conductive wire. The output source/drain region is further connected to a frontside contact portion (CA2).

Figure 1E:
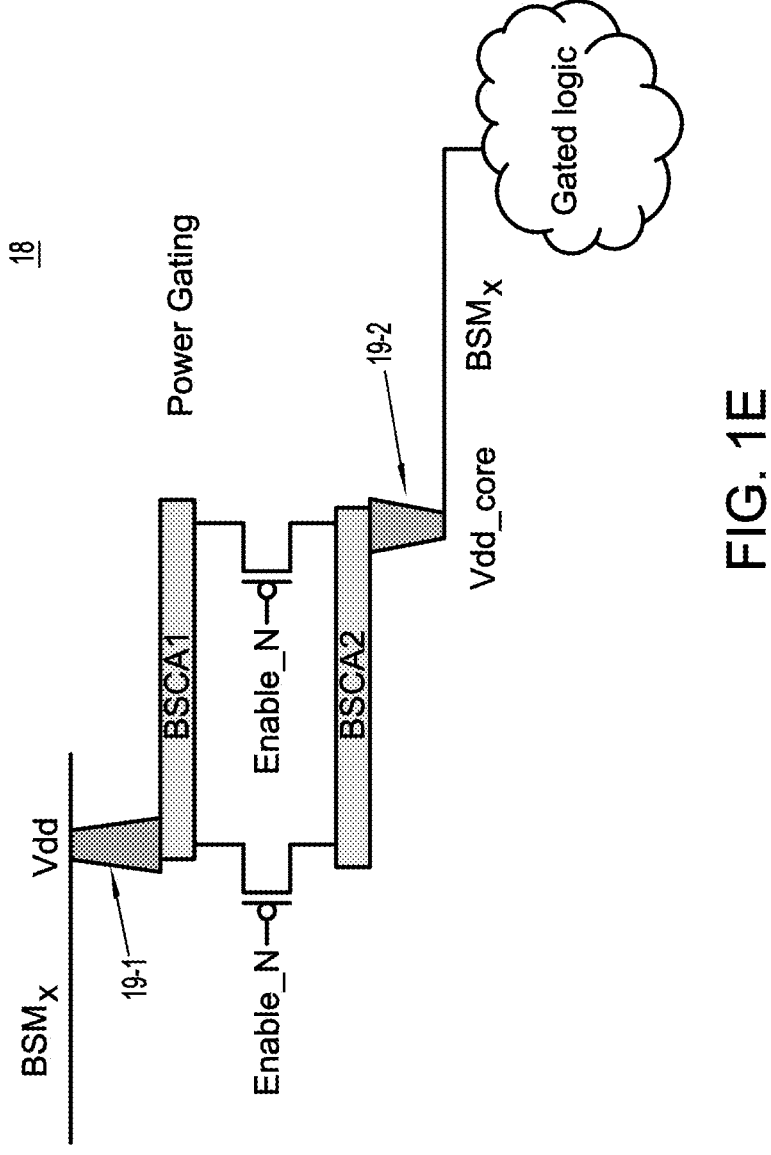
FIG. 1E depicts a schematic circuit diagram of the transistor structure of FIG. 1A with source/drain regions of adjacent transistors connected to common backside contacts, according to an embodiment of the invention.

The schematic circuit diagram 18 of FIG. 1E illustrates the source/drain regions of adjacent transistors connected to common backside contacts. As shown in FIG. 1E, input source/drain regions of each transistor are connected to the supply voltage (Vdd) through a direct backside contact (DBC) comprising the conductive wire 19-1 directly contacting the first backside contact portion (BSCA1). Output source/drain regions of each transistor are connected to a core power supply voltage (Vdd_core) through another direct backside contact (DBC) comprising another conductive wire 19-2 directly contacting a second backside contact portion (BSCA2). Each conductive wire 19-1 and 19-2 is connected to a different portion of a backside metallization layer (BSMx), which may comprise, for example, a backside power delivery network, and the conductive wires 19-1 and 19-2 may comprise backside power rails. Similar to the circuit diagram 10 in FIG. 1A, the core power supply voltage (Vdd_core) is supplied to gated logic. As can be seen in FIG. 1B, at least one common gate PC is connected across the two transistors, which supplies the common gate input (Enable_N). In addition, in FIG. 1B, the direct backside contacts (DBC) are self-aligned with top and bottom edges of the active area (RX) (e.g., source/drain regions) of each of the two transistors.

FIG. 1C depicts a circuit diagram 14 illustrating a transistor structure with an output signal to a backside of a semiconductor device, and FIG. 1D depicts a top view of a transistor structure 16 corresponding to the circuit diagram 14 of FIG. 1C with source/drain regions of adjacent transistors connected to common backside contacts. As shown in the circuit diagram 14 in FIG. 1C, an inverter circuit includes a common gate input (IN) to gates of two transistors. An input voltage of one of the transistors is a supply (drain) voltage (Vdd) and an input voltage of the other transistor in the circuit diagram 14 is a source voltage (Vss). The outputs (OUT) of the two transistors in the circuit diagram 14 are provided to a backside of a device.

Similar to the transistor structure 12, the transistor structure 16 includes two adjacent p-type transistors, each comprising an active area (RX). Alternatively, the transistor structure 16 includes two n-type transistors. In either case, the two transistors have the same doping type. The transistor structure 16 further includes a third transistor adjacent to and having a different doping type than the two transistors having the same doping type. For example, in the diagram in FIG. 1D, the third transistor is an n-type transistor. However, if the first two transistors were n-type, then the third transistor would be a p-type transistor. Similar to the transistor structure 12, according to an embodiment, input source/drain regions of each p-type transistor in the transistor structure 16 are connected to the supply voltage (Vdd)

through a direct backside contact (DBC) to a conductive wire (e.g., metal wire), and output source/drain regions of each p-type transistor are commonly connected to a portion of a backside metallization layer (BSMx) through another direct backside contact (DBC) to another conductive wire. The input source/drain region of the third transistor (n-type) in the transistor structure 16 is separately connected to the source voltage (Vss). In an embodiment, the output source/drain region of the third transistor is commonly connected to the same portion of the backside metallization layer (BSMx) as the first and second transistors. In other words, each of the three transistors have the same source/drain output (OUT), the two p-type transistors have the same source/drain input (Vdd) and the third transistor (n-type) has a different source/drain input (Vss). Each conductive wire is connected to a different portion of a backside metallization layer (BSMx), which may comprise, for example, a backside power delivery network. The conductive wires may comprise, for example, backside power rails. As can be seen in FIG. 1D, at least one common gate PC is connected across the three transistors, which supplies the common gate input (IN). In addition, in FIG. 1D, the direct backside contacts (DBCs) are self-aligned with top and bottom edges of the active areas (RX) (e.g., source/drain regions) of each of the three transistors.

Figures 2A, 2B, 2C, 2D:
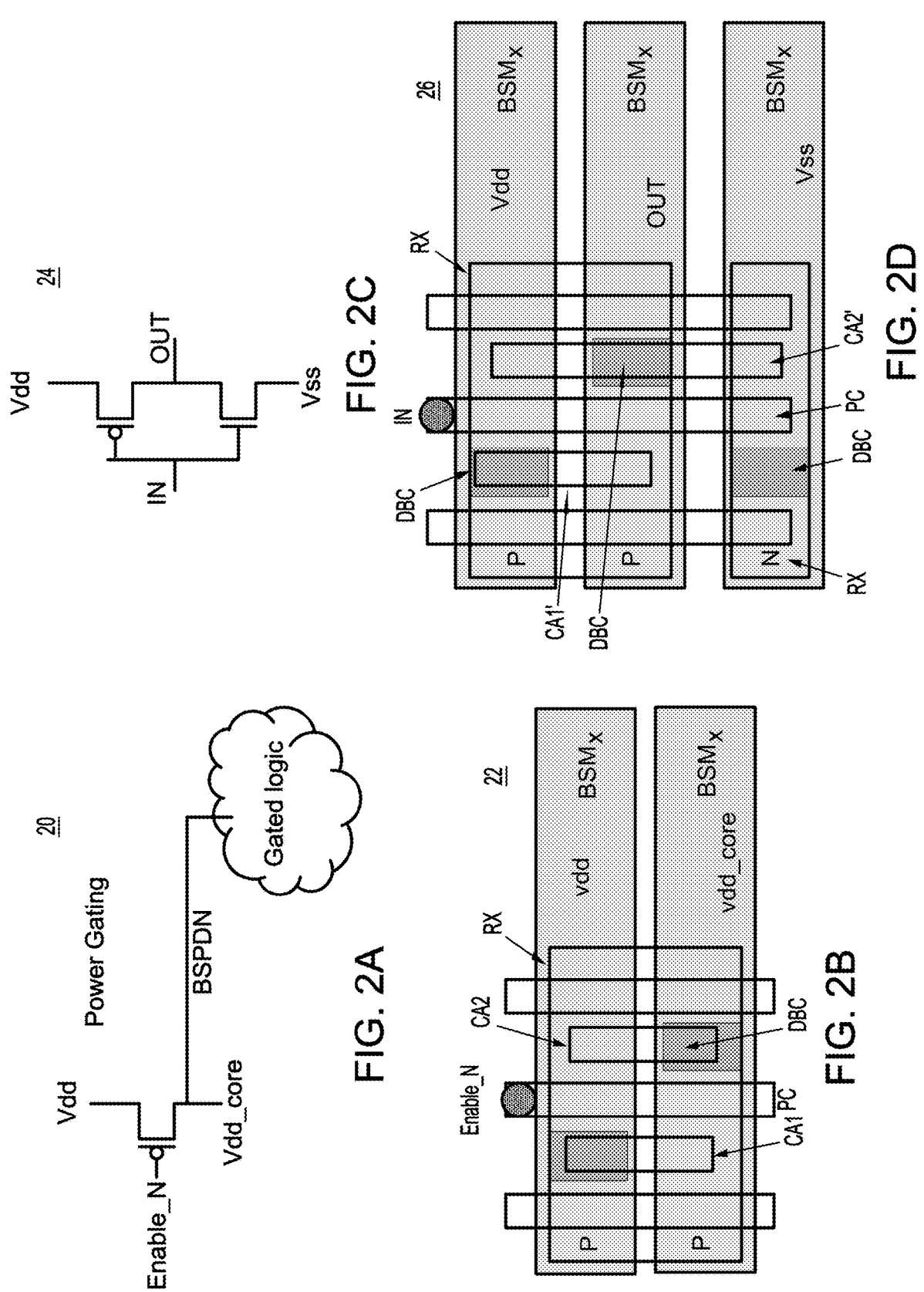
FIG. 2A depicts a circuit diagram illustrating a transistor structure with backside power distribution, according to an embodiment of the invention.
FIG. 2B depicts a top view of a transistor structure in accordance with the circuit diagram of FIG. 2A with source/drain regions of merged transistors connected to common backside contacts, according to an embodiment of the invention.
FIG. 2C depicts a circuit diagram illustrating a transistor structure with an output signal to a backside, according to an embodiment of the invention.
FIG. 2D depicts a top view of a transistor structure corresponding to the circuit diagram of FIG. 2C with source/drain regions of merged transistors connected to common backside contacts, according to an embodiment of the invention.

The circuit diagrams 20 and 24 in FIGS. 2A and 2C are the same as the circuit diagrams 10 and 14 in FIGS. 1A and 1C and are shown as reference for the transistor structures 22 and 26 in FIGS. 2B and 2D. Similar to the transistor structures 12 and 16, the transistor structures 22 and 26 correspond to the circuit diagrams 20 and 24. The transistor structures 22 and 26 are similar to the transistor structures 12 and 16, except that source/drain regions of merged transistors are connected to common backside contacts. In more detail, the two transistors in the transistor structure 22 are a merged transistor where the active area (RX) is continuous for the two transistors. Similarly, in the transistor structure 26, the two transistors of the same type (p-type in this case) are a merged transistor where the active area (RX) is continuous for these two transistors. As a result of the differently configured active areas in the transistor structures 22 and 26, in FIG. 2B, the direct backside contacts (DBCs) are self-aligned with only one edge (either a top or a bottom edge) of the active area (RX) (e.g., source/drain regions) of the merged transistor. As can be seen, the frontside contact portions CA1, CA2, CA1' and CA2' in the transistor structures 22 and 26 are the same as the frontside contact portions CA1, CA2, CA1' and CA2' in the transistor structures 12 and 16. In the transistor structures 22 and 26, while frontside contact portions CA1, CA2, CA1' may be omitted, frontside contact portion CA2' needs to be maintained since it is required to connect the output S/D region of the p-type transistor (e.g., pFET) to the output S/D region of the n-type transistor (e.g., nFET). Frontside contact portion CA2' also needs to be maintained in the transistor structure 16. As noted herein above, in the transistor structure 12, the input source/drain region may optionally be connected to a frontside contact portion (CA1), but frontside contact CA2 portion is required in that embodiment. In other respects, the transistor structures 22 and 26 are the same as the transistor structures 12 and 16.

As used herein, "frontside or "first side" refers to a side on top of the first and second semiconductor substrates 101 and 103 and/or in front of, on top of or in an upward direction from the stacked nanosheet/gate and channel layers of the transistors in the orientation shown in the cross-sectional figures. As used herein, "backside" or "second side" refers to a side below the first and/or second semiconductor substrates 101 and 103 and/or behind, below or in a downward direction from the stacked nanosheet/gate and channel layers of the transistors in the orientation shown in the cross-sectional figures (e.g., opposite the "frontside").

Figure 3:
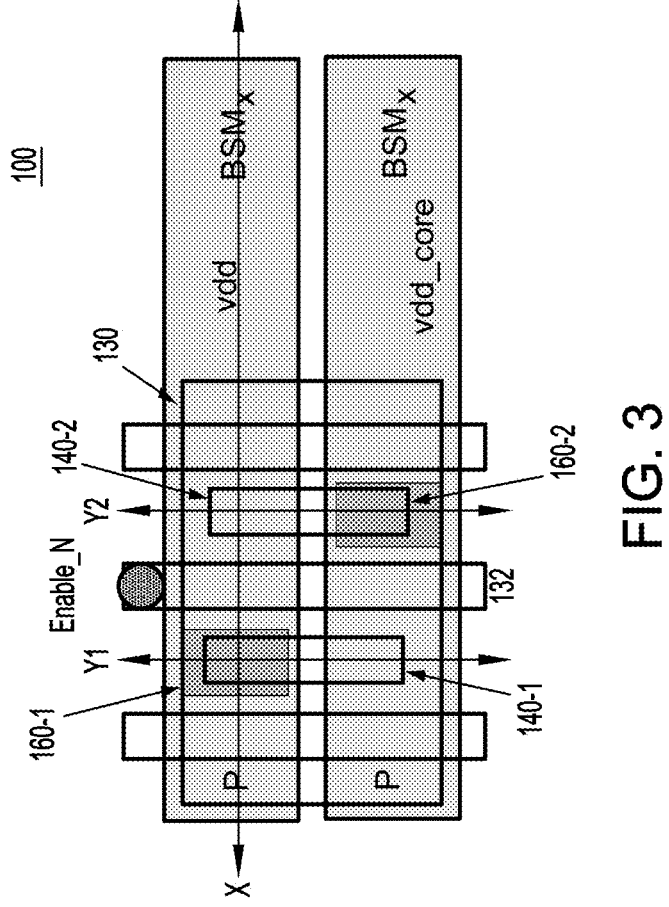
FIG. 3 depicts the top view of FIG. 2B with lines X, Y1 and Y2 on which the cross-sectional views of FIGS. 4A-16C are based, according to an embodiment of the invention.

For a semiconductor structure 100, FIG. 3 depicts the top view of FIG. 2B with lines X, Y1 and Y2 on which the cross-sectional views of FIGS. 4A-16C are based, according to an embodiment of the invention. Referring to FIGS. 4A-4C, first and second semiconductor substrates 101 and 103 comprise semiconductor material including, but not limited to, silicon (Si), III-V, II-V compound semiconductor materials or other like semiconductor materials. In addition, multiple layers of the semiconductor materials can be used as the semiconductor material of the first and second semiconductor substrates 101 and 103. The first and second semiconductor substrates 101 and 103 may also be referred herein to as first and second semiconductor substrates 101 and 103. An etch stop layer 102 is formed on the first semiconductor substrate 101, and may comprise, for example, silicon oxide ($SiO_x$) (where x is for example, 2, 1.99 or 2.01), or silicon germanium (SiGe). The second semiconductor substrate 103 comprising, for example, the same semiconductor material as the first semiconductor substrate 101, or other like semiconductor material, is formed on the etch stop layer 102.

As can be seen in FIGS. 4B and 4C, portions of the second semiconductor substrate 103 are recessed to a lower height. A dielectric layer 104 fills in the recessed portions of the second semiconductor substrate 103 to form a plurality of isolation regions (e.g., shallow trench isolation (STI) regions). The dielectric layer 104 may comprise, for example, silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN) and combinations thereof, and is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

In accordance with an embodiment of the present invention, a dielectric layer 109 (also referred to as a bottom dielectric insulator (BDI) layer) is formed on the second semiconductor substrate 103. The dielectric layer 109 may comprise, for example, SiN, SiON, SiCN, BN, SiBCN, SiOCN and combinations thereof, and is deposited using deposition techniques such as, for example, CVD, PECVD, RFCVD, PVD, ALD, MBD, PLD, and/or LSMCD.

Layers of silicon germanium (SiGe), and of silicon (Si) are stacked in an alternating configuration on the dielectric layer 109, so that a first SiGe layer is followed by a first Si layer on the first SiGe layer, which is followed by a second SiGe layer on the first Si layer, and so on. As can be understood, SiGe layers and Si layers are epitaxially grown. The stacked nanosheet layers of SiGe layers and Si layers are patterned into nanosheet stacks comprising SiGe layers 105 and Si layers 107 as shown in FIG. 4A. While three SiGe layers 105 and three Si layers 107 are shown, the embodiments of the present invention are not necessarily limited to the shown number of layers 105, 107, and there may be more or less layers in the same alternating configuration depending on design constraints. For ease of explanation, three nanosheet stacks are shown. However, the embodiments are not limited thereto, and more or less than three nanosheet stacks can be formed.

The SiGe layers 105 are also referred to herein as sacrificial semiconductor layers since, as described further herein, the SiGe layers 105 are eventually removed and replaced by gate structures. Although SiGe is described as a sacrificial material for SiGe layers 105, and Si is described as a nanosheet channel material for Si layers 107, other materials can be used, as long as the sacrificial semiconductor layers have the property of being able to be removed selectively compared to the nanosheet channel material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low-pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

Dummy gate portions 111 are formed on the uppermost Si layers 107 and around the stacked nanosheet configurations of the SiGe layers 105 and Si layers 107. The dummy gate portions 111 include, but are not necessarily limited to, an amorphous silicon (a-Si) layer. The dummy gate portions 111 are deposited using deposition techniques such as, for example, CVD, PECVD, RFCVD, PVD, ALD, MBD, PLD, LSMCD, sputtering and/or plating, followed by a planarization process, such as, chemical mechanical planarization (CMP), and lithography and etching steps to remove excess dummy gate material, and pattern the deposited layer. Hardmask layers 120 are formed on the dummy gate portions 111. The hardmask portions comprise, for example, a nitride such as SiN or other nitride material.

Referring to FIG. 4A, due to the germanium in SiGe layers 105, lateral etching of the SiGe layers 105 can be performed selective to Si layers 107, such that the side portions of the SiGe layers 105 can be removed to create vacant areas to be filled in by inner spacers 113. The material of the inner spacers 113 can comprise, but is not necessarily limited to, a nitride, such as, SiN, SiON, SiCN, BN, SiBN, SiBCN or SiOCN. Gate spacers 112 are positioned on the nanosheet stacks on opposite lateral sides of the dummy gate portions 111. The gate spacers 112 are formed from the same or similar material to that of the inner spacers 113. The inner and gate spacers 113 and 112 can be formed by any suitable techniques such as deposition followed by directional etching. Deposition may include, but is not limited to, ALD or CVD. Directional etching may include but is not limited to, reactive ion etching (RIE).

Referring to FIGS. 5A-5C, protective spacers 115 are formed on sides of the nanosheet stacks including the Si layers 107, gate spacers 112 and inner spacers 113. The protective spacers 115 are formed from, for example, SiN. In an illustrative embodiment, a thickness of the protective spacers 115 is about 20 angstroms. The protective spacers 115 can be formed by any suitable techniques such as deposition followed by directional etching. Deposition may include, but is not limited to, ALD or CVD. Directional etching may include but is not limited to RIE.

Following formation of the protective spacers 115, an organic planarization layer (OPL) 122 is formed on the hardmask layers 120 and between the nanosheet stacks on the dielectric layer 109. The OPL 122 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 122 can be deposited, for example, by spin coating. Openings 123-1 and 123-2 are formed in the OPL 122 corresponding to where backside source/drain contacts 160-1 and 160-2 (see FIGS. 15A-16C) are to be formed.

An etching process such as, for example, RIE, is performed via the openings 123-1 and 123-2 in the OPL 122 to form openings 124-1 and 124-2 (e.g., trenches) in the second semiconductor substrate 103 where the backside source/drain contacts 160-1 and 160-2 will be formed. The openings 124-1 and 124-2 are formed by etching through part of dielectric layer 109 and part of the second semiconductor substrate 103.

Referring to FIGS. 6A-6C, the OPL 122 is removed, and the openings 124-1 and 124-2 are filled with sacrificial placeholder layers 125-1 and 125-2 comprising, for example, SiGe, III-V semiconductor material or other semiconductor material. The OPL 122 is stripped using, for example, oxygen plasma, nitrogen/hydrogen plasma or other carbon strip process. OPL stripping causes minimal or no damage to exposed layers. The sacrificial placeholder layers 125-1 and 125-2 are deposited in the openings 124-1 and 124-2 using deposition techniques such as, for example, CVD, PECVD, RFCVD, PVD, ALD, MBD, PLD, and/or LSMCD, followed by a planarization process, such as, CMP. The CMP process removes excess portions of the sacrificial placeholder layers 125-1 and 125-2 deposited on top of the dielectric layer 109. As can be seen in FIGS. 6A-6C, the top surfaces of the sacrificial placeholder layers 125-1 and 125-2 are co-planar with top surfaces of top surfaces of the dielectric layer 109.

Figures 7A, 7B, 7C:
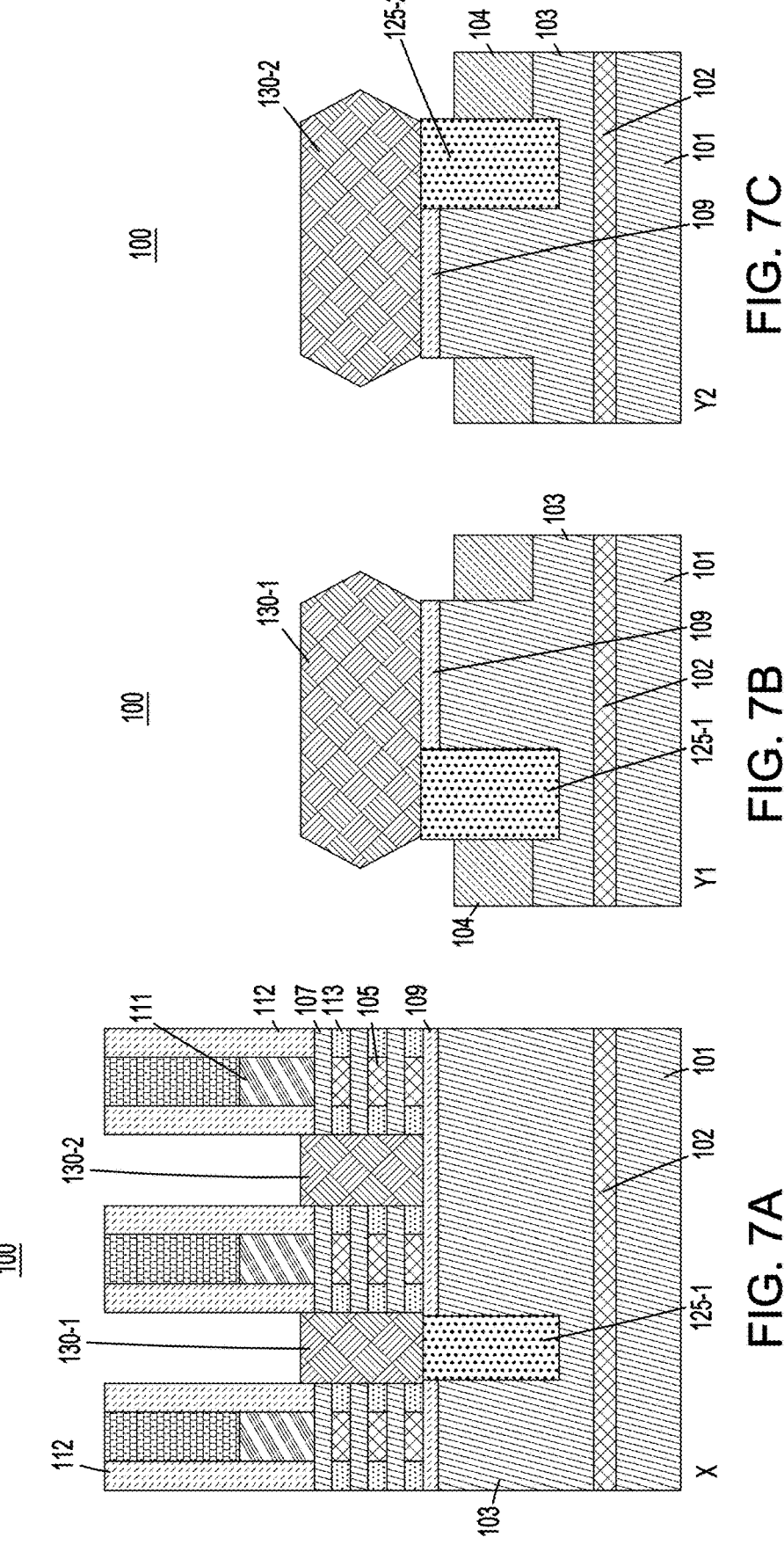
FIG. 7A depicts a first cross-sectional view corresponding to the line X in FIG. 3 following protective spacer removal and source/drain region formation, according to an embodiment of the invention.
FIG. 7B depicts a second cross-sectional view corresponding to the line Y1 in FIG. 3 following protective spacer removal and source/drain region formation, according to an embodiment of the invention.
FIG. 7C depicts a third cross-sectional view corresponding to the line Y2 in FIG. 3 following protective spacer removal and source/drain region formation, according to an embodiment of the invention.

Referring to FIGS. 7A-7C, the protective spacers 115 are removed using, for example, an isotropic dry or wet etch process, and source/drain regions 130-1 and 130-2 are epitaxially grown between the nanosheet stacks. The source/drain regions 130-1 and 130-2 comprise epitaxial layers grown from sides of Si layers 107. The Si layers 107 will function as the nanosheet channel layers. As can be seen, the source/drain regions 130-1 and 130-2 are formed on the sacrificial placeholder layers 125-1 and 125-2.

Figures 8A, 8B, 8C:
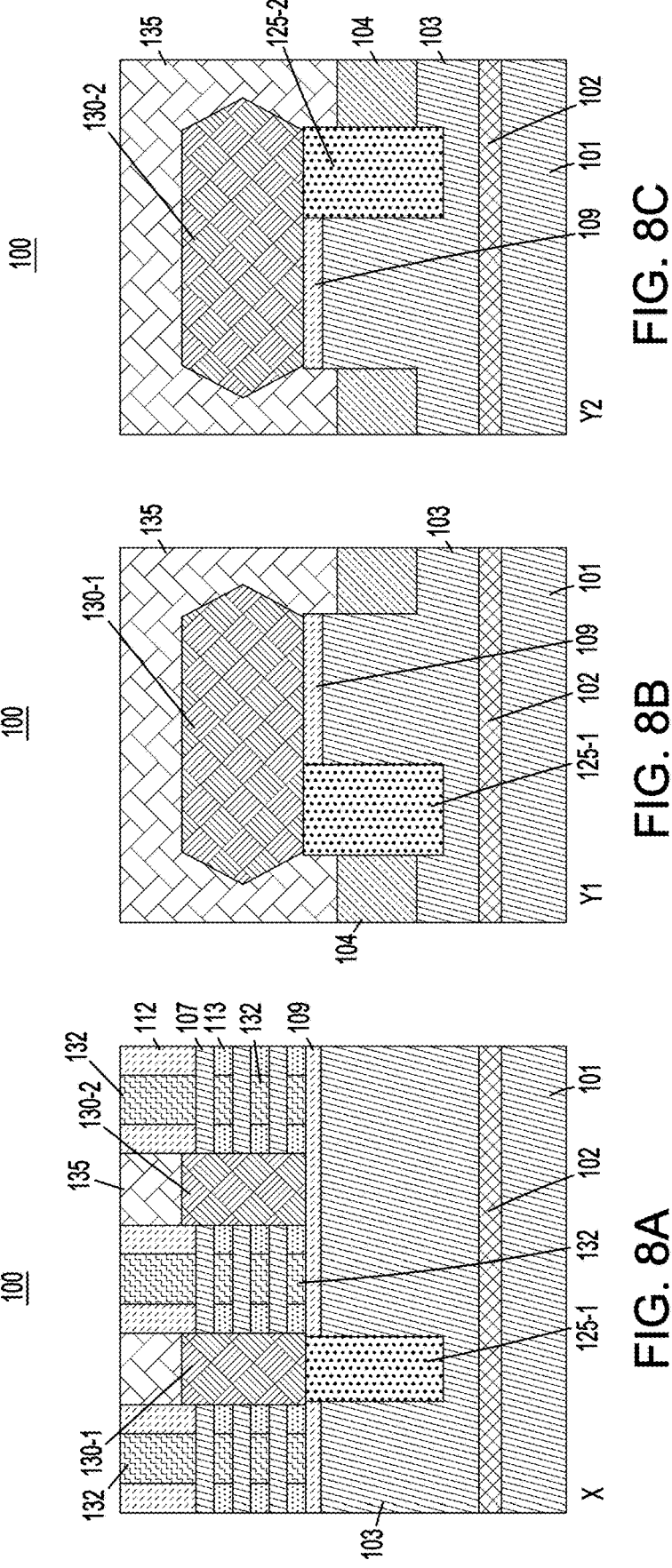
FIG. 8A depicts a first cross-sectional view corresponding to the line X in FIG. 3 following inter-layer dielectric (ILD) layer formation and replacement metal gate (RMG) formation, according to an embodiment of the invention.
FIG. 8B depicts a second cross-sectional view corresponding to the line Y1 in FIG. 3 following ILD layer and RMG formation, according to an embodiment of the invention.
FIG. 8C depicts a third cross-sectional view corresponding to the line Y2 in FIG. 3 following ILD layer and RMG formation, according to an embodiment of the invention.

Referring to FIGS. 8A-8C, an inter-layer dielectric (ILD) layer 135 is deposited to fill in portions on and around the source/drain regions 130-1 and 130-2. The ILD layer 135 is deposited using deposition techniques such as, for example, CVD, PECVD, RFCVD, PVD, ALD, MBD, PLD, and/or LSMCD, followed by a planarization process, such as, CMP to remove excess portions of the ILD layer 135 deposited on top of the hardmask layers 120 and gate spacers 112, and to remove the hardmask layers 120 and portions of the gate spacers 112 to expose the dummy gate portions 111. The ILD layer 135 may comprise, for example, $SiO_x$, SiOC, SiOCN or some other dielectric.

The dummy gate portions 111 are selectively removed to create vacant areas where gate structures will be formed in place of the dummy gate portions 111. The selective removal can be performed using, for example hot ammonia to remove a-Si. In addition, the SiGe layers 105 are selectively removed to create vacant areas where gate structures will be formed in place of the SiGe layers 105. The SiGe layers 105 are selectively removed with respect to the Si layers 107. The selective removal can be performed using, for example, a dry HCl etch.

Following removal of the dummy gate portions 111 and SiGe layers 105, the Si layers 107 are suspended, and gate regions 132, including, for example, gate and dielectric portions are formed in the vacant portions left by removal of the dummy gate portions 111, and the SiGe layers 105. In illustrative embodiments, each gate region 132 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate regions 132 each include a metal gate portion including a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TIN, TaN, which can be deposited on the gate dielectric layer. The metal gate portions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. It should be appreciated that various other materials may be used for the metal gate portions as desired.

Figures 9A, 9B, 9C:
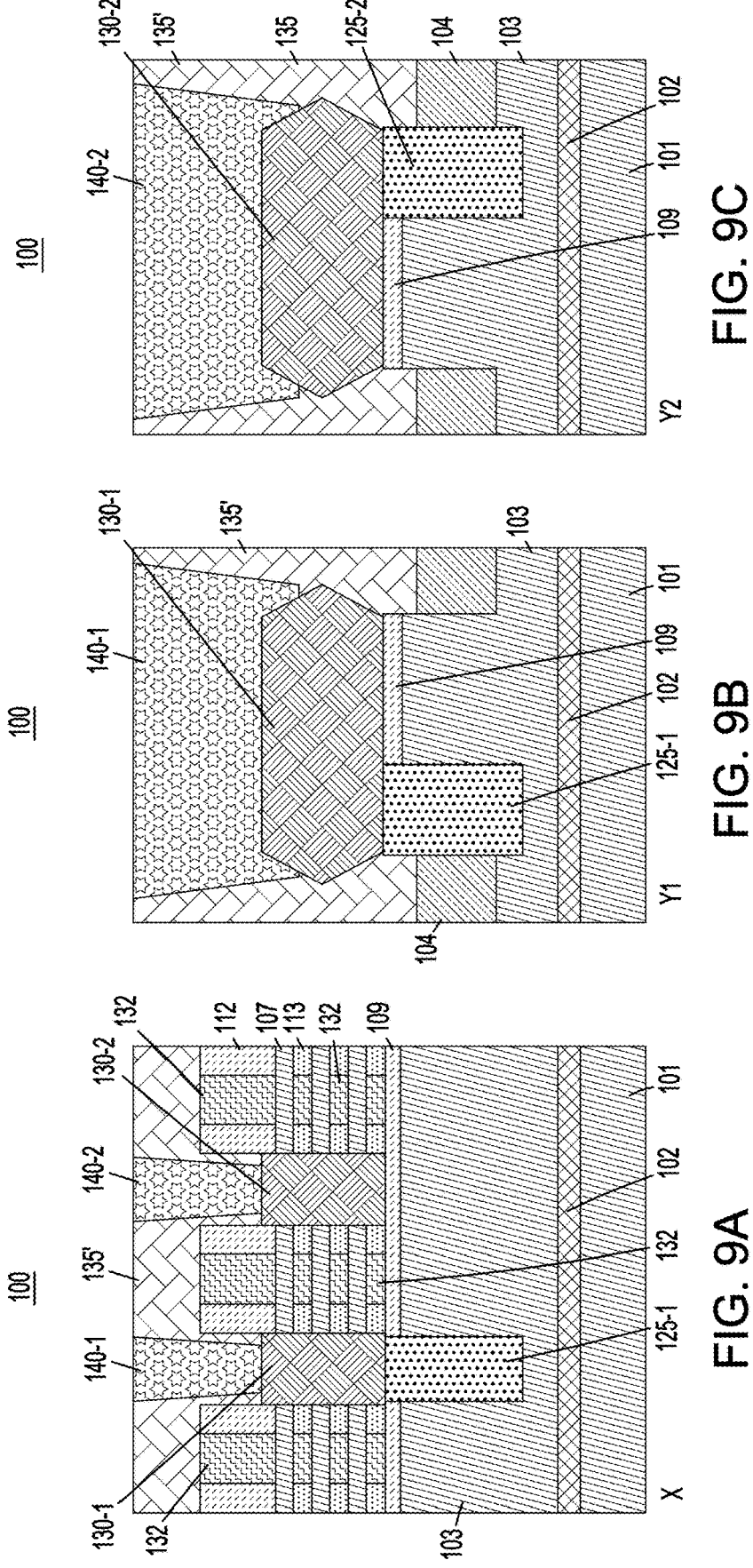
FIG. 9A depicts a first cross-sectional view corresponding to the line X in FIG. 3 following middle-of-line (MOL) ILD layer formation and source/drain contact formation, according to an embodiment of the invention.
FIG. 9B depicts a second cross-sectional view corresponding to the line Y1 in FIG. 3 following MOL ILD layer formation and source/drain contact formation, according to an embodiment of the invention.
FIG. 9C depicts a third cross-sectional view corresponding to the line Y2 in FIG. 3 following MOL ILD layer formation and source/drain contact formation, according to an embodiment of the invention.

Referring to FIGS. 9A-9C, additional ILD material is deposited to form an additional ILD layer 135' on top of the ILD layer 135. Then, frontside source/drain contacts 140-1 and 140-2 are formed in the ILD layers 135 and 135'. In forming the frontside source/drain contacts 140-1 and 140-2, openings are formed through portions of the ILD layers 135 and 135'. The openings expose portions the source/drain regions 130-1 and 130-2 on which the frontside source/drain contacts 140-1 and 140-2 are to be formed. According to an embodiment, masks are formed on parts of the ILD layer 135', and exposed portions of the ILD layers 135 and 135' corresponding to where the openings are to be formed are removed using, for example, a dry etching process using a RIE or ion beam etch (IBE) process, a wet chemical etch process or a combination of these etching processes. A dry etch may be performed using a plasma. Such wet or dry etch processes include, for example, IBE by Ar/CHF3 based chemistry.

Metal layers are deposited in the openings to form the frontside source/drain contacts 140-1 and 140-2. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, chemical mechanical planarization (CMP) to remove excess portions of the metal layers from on top of the ILD layer 135'. Frontside source/drain contacts 140-1 and 140-2 are used in addition to the backside source/drain contacts 160-1 and 160-2 in order to fully strap the source/drain regions 130-1 and 130-2.

The frontside source/drain contacts 140-1 and 140-2 contact respective ones of the source/drain regions 130-1 and 130-2. The frontside source/drain contacts 140-1 and 140-2 extend through the ILD layers 135 and 135' to land on and contact the corresponding source/drain regions 130-1 and 130-2.

Figures 10A, 10B, 10C:
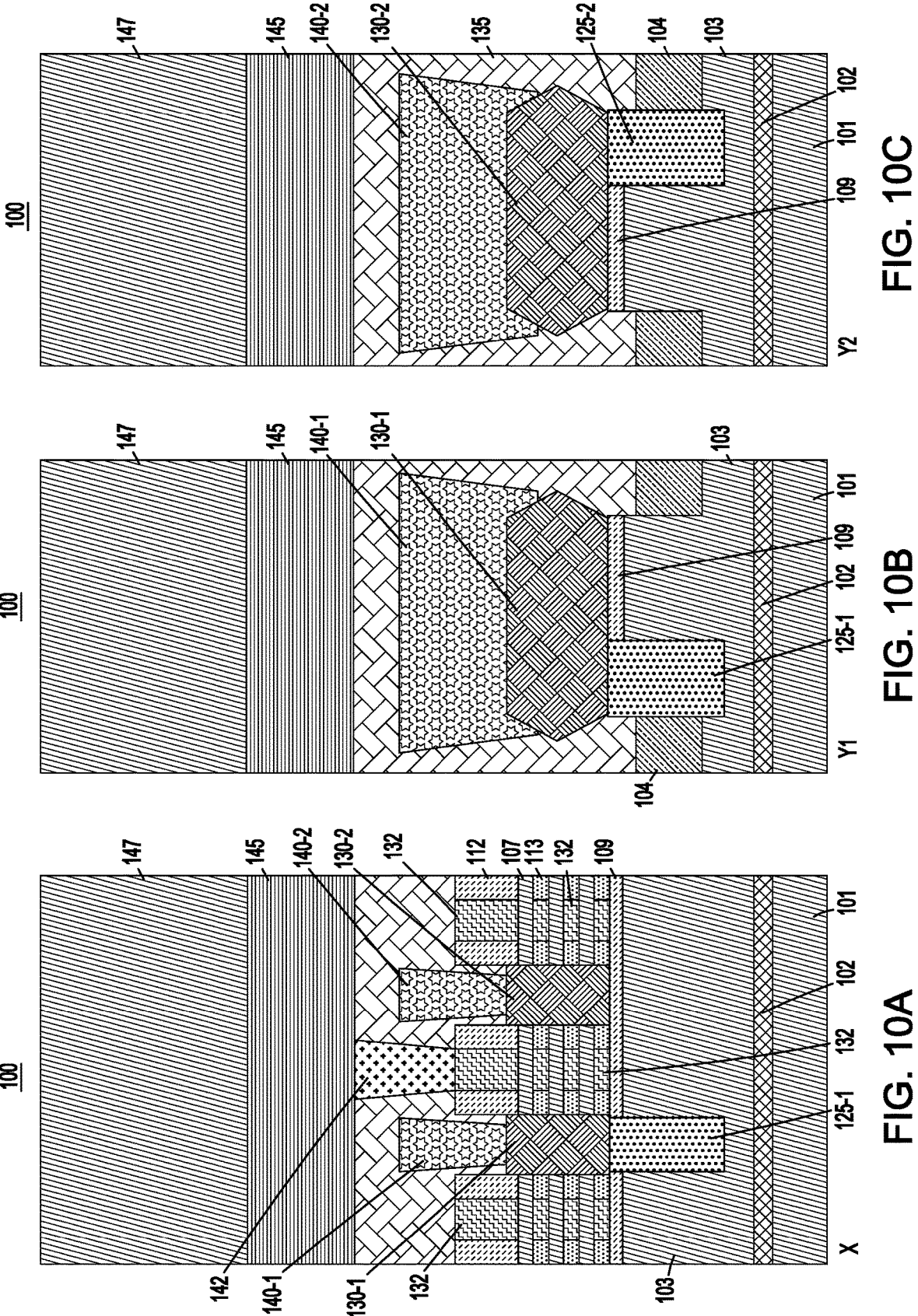
FIG. 10A depicts a first cross-sectional view corresponding to the line X in FIG. 3 following back-end-of-line (BEOL) interconnect formation and carrier wafer bonding, according to an embodiment of the invention.
FIG. 10B depicts a second cross-sectional view corresponding to the line Y1 in FIG. 3 following BEOL interconnect formation and carrier wafer bonding, according to an embodiment of the invention.
FIG. 10C depicts a third cross-sectional view corresponding to the line Y2 in FIG. 3 following BEOL interconnect formation and carrier wafer bonding, according to an embodiment of the invention.

Referring to FIGS. 10A-10C, a frontside gate contact 142 is formed through the ILD layer 135' to land on and contact a corresponding gate region 132 (may also be referred to as a gate structure). The process and materials used for forming the frontside gate contact 142 are similar to those used for forming the frontside source/drain contacts 140-1 and 140-2. Frontside BEOL interconnects 145 are formed on the ILD layer 135' including the frontside source/drain contacts 140-1 and 140-2 and the frontside gate contact 142. As can be seen, the frontside gate contact 142 contacts the frontside BEOL interconnects 145, and the frontside source/drain contacts 140-1 and 140-2 do not contact and are not electrically connected to the frontside BEOL interconnects 145. A carrier wafer 147 is bonded to the frontside BEOL interconnects 145. The frontside BEOL interconnects 145 include various BEOL interconnect structures which may electrically connect to the frontside gate contact 142. In an alternative embodiment, one or more of the frontside source/drain contacts 140-1 and 140-2 may electrically connect to the frontside BEOL interconnects 145. The carrier wafer 147 may be formed of materials similar to that of the first and second semiconductor substrates 101 and 103, and may be formed over the frontside BEOL interconnects 145 using a wafer bonding process, such as dielectric-to-dielectric bonding.

Figures 11A, 11B, 11C:
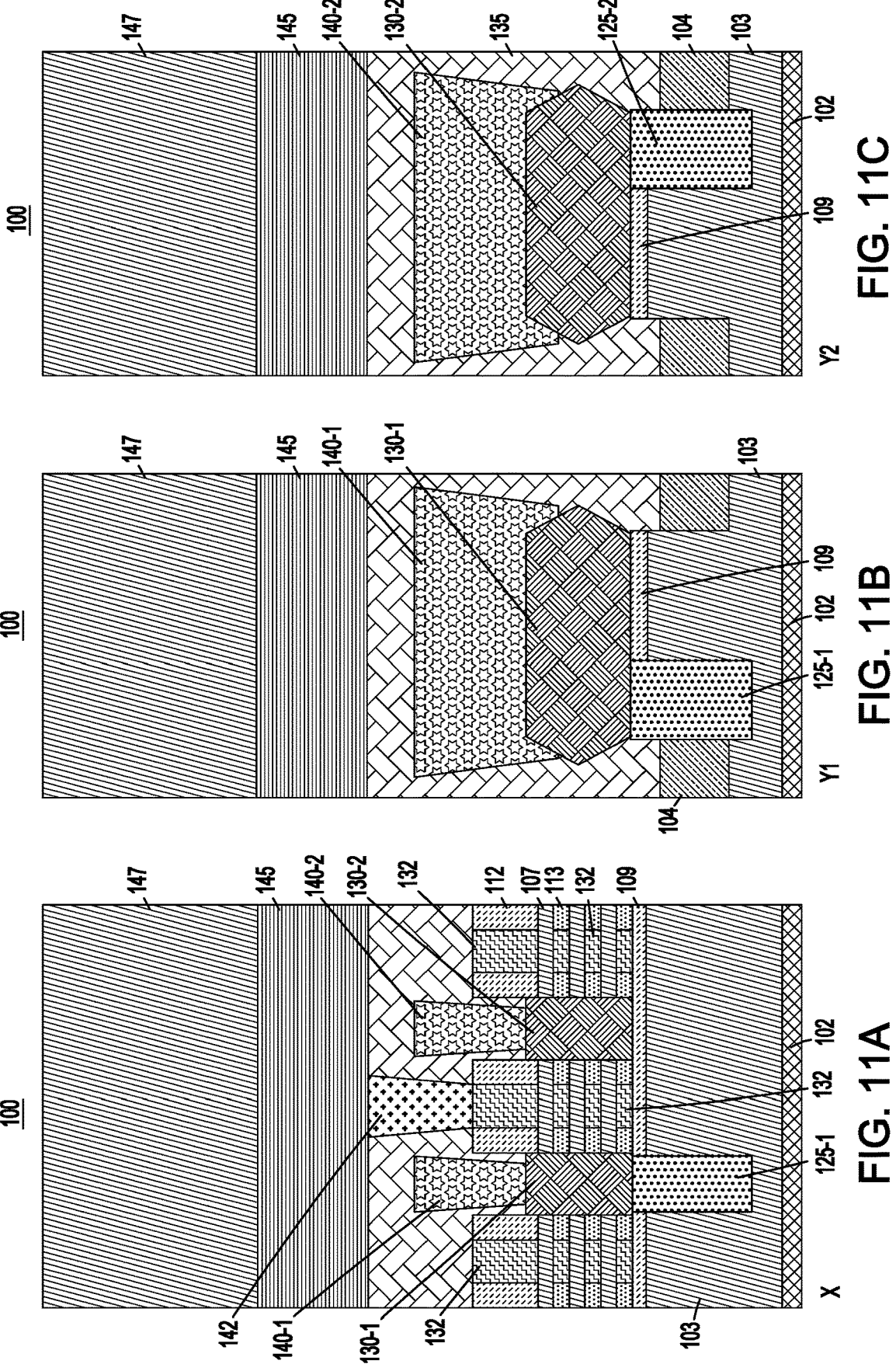
FIG. 11A depicts a first cross-sectional view corresponding to the line X in FIG. 3 following substrate removal, according to an embodiment of the invention.
FIG. 11B depicts a second cross-sectional view corresponding to the line Y1 in FIG. 3 following substrate removal, according to an embodiment of the invention.
FIG. 11C depicts a third cross-sectional view corresponding to the line Y2 in FIG. 3 following substrate removal, according to an embodiment of the invention.

Referring to FIGS. 11A-11C, using the carrier wafer 147, the semiconductor structure 100 may be "flipped" (e.g., rotated 180 degrees) so that the structure is inverted. In addition, the first semiconductor substrate 101 is removed from the backside of the semiconductor structure 100. The removal process, which comprises etching of the first semiconductor substrate 101, stops at the etch stop layer 102 as illustrated in FIGS. 11A-11C. For example, the first semiconductor substrate 101 is selectively etched with an etchant that selectively etches silicon with respect to a material of the etch stop layer 102 (e.g., $SiO_2$ or SiGe).

Figures 12A, 12B, 12C:
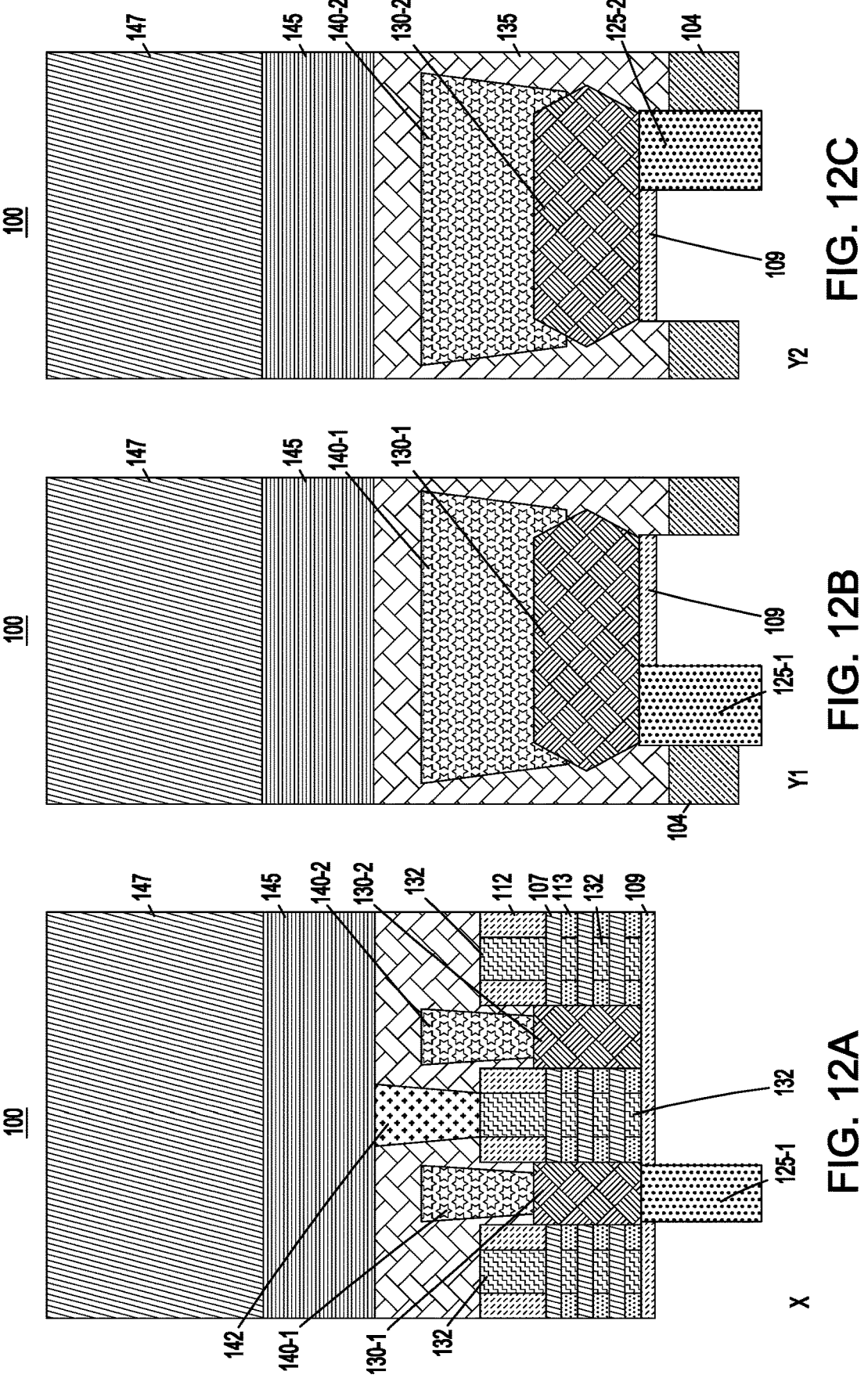
FIG. 12A depicts a first cross-sectional view corresponding to the line X in FIG. 3 following etch stop and silicon layer removal, according to an embodiment of the invention.
FIG. 12B depicts a second cross-sectional view corresponding to the line Y1 in FIG. 3 following etch stop and silicon layer removal, according to an embodiment of the invention.
FIG. 12C depicts a third cross-sectional view corresponding to the line Y2 in FIG. 3 following etch stop and silicon layer removal, according to an embodiment of the invention.

Referring to FIGS. 12A-12C, the etch stop layer 102 and the second semiconductor substrate 103 (e.g., silicon layer) are selectively removed from the semiconductor structure 100 with respect to the sacrificial placeholder layers 125-1 and 125-2 and the dielectric layers 104 (e.g., STI regions). As shown in FIGS. 12A-12C, the etch stop layer 102 is removed, followed by removal of the second semiconductor substrate 103, wherein portions of the dielectric layers 104, dielectric layer 109, and the sacrificial placeholder layers 125-1 and 125-2 are exposed. Etching processes for removal of the etch stop layer 102 include, for example, IBE by Ar/CHF3 based chemistry.

Figures 13A, 13B, 13C:
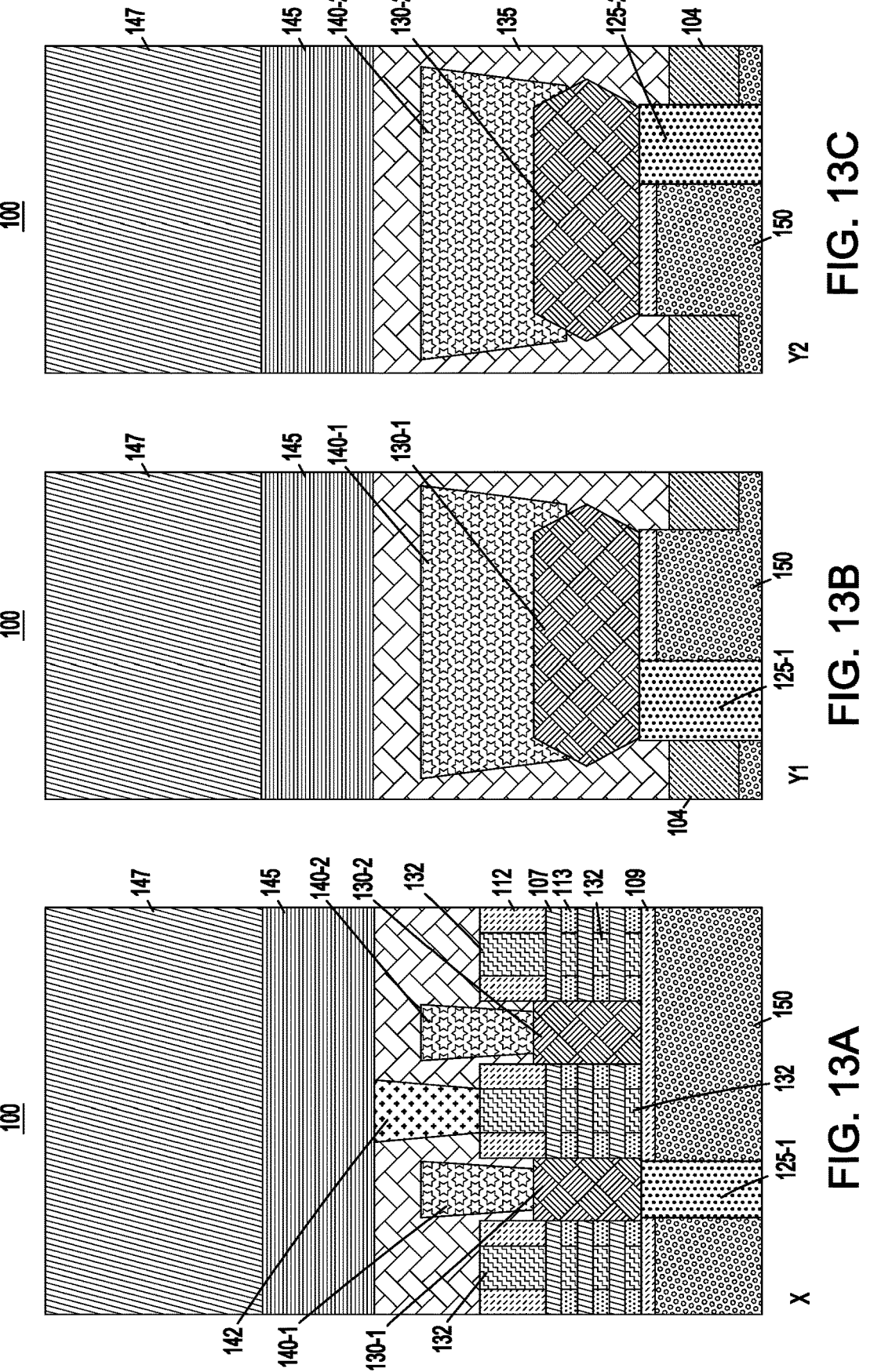
FIG. 13A depicts a first cross-sectional view corresponding to the line X in FIG. 3 following backside ILD layer formation and planarization, according to an embodiment of the invention.
FIG. 13B depicts a second cross-sectional view corresponding to the line Y1 in FIG. 3 following backside ILD layer formation and planarization, according to an embodiment of the invention.
FIG. 13C depicts a third cross-sectional view corresponding to the line Y2 in FIG. 3 following backside ILD layer formation and planarization, according to an embodiment of the invention.

Referring to FIGS. 13A-13C, a backside ILD layer 150 is deposited to fill in areas formerly occupied by the second semiconductor substrate 103. The backside ILD layer 150 is deposited using deposition techniques such as, for example, CVD, PECVD, RFCVD, PVD, ALD, MBD, PLD, and/or LSMCD, followed by a planarization process, such as, CMP to remove excess portions of the backside ILD layer 150 deposited on top of the sacrificial placeholder layers 125-1 and 125-2 and dielectric layers 104 so that the backside ILD layer is coplanar with surfaces of the sacrificial placeholder layers 125-1 and 125-2. The surfaces of the sacrificial placeholder layers 125-1 and 125-2 are exposed following the CMP process. The backside ILD layer 150 may comprise, for example, SiOx, SiOC, SiOCN or some other dielectric.

Figures 14A, 14B, 14C:
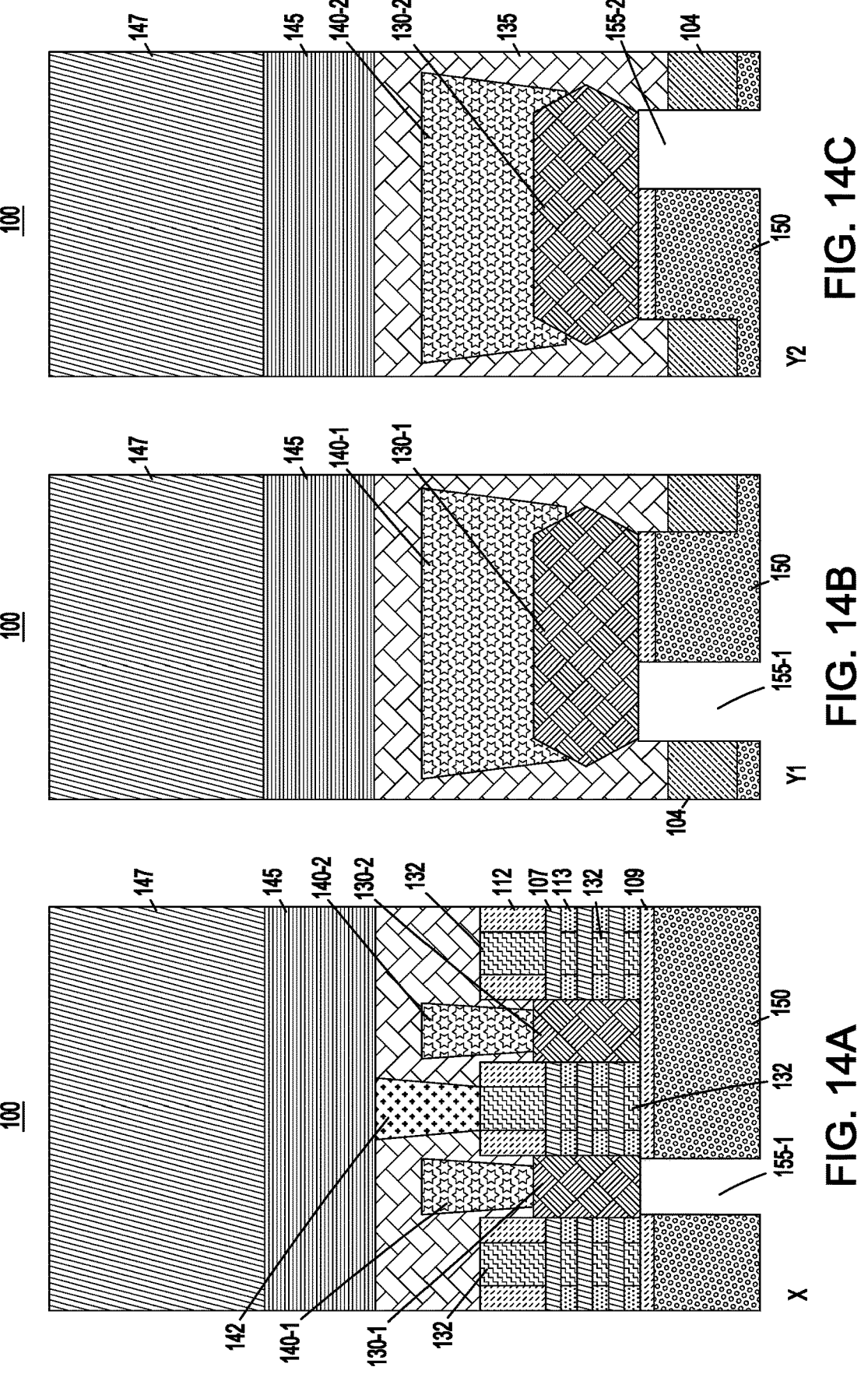
FIG. 14A depicts a first cross-sectional view corresponding to the line X in FIG. 3 following sacrificial layer removal, according to an embodiment of the invention.
FIG. 14B depicts a second cross-sectional view corresponding to the line Y1 in FIG. 3 following sacrificial layer removal, according to an embodiment of the invention.
FIG. 14C depicts a third cross-sectional view corresponding to the line Y2 in FIG. 3 following sacrificial layer removal, according to an embodiment of the invention.

Referring to FIGS. 14A-14C, the sacrificial placeholder layers 125-1 and 125-2 are selectively removed to expose backside portions of the source/drain regions 130-1 and 130-2. The sacrificial placeholder layers 125-1 and 125-2 are removed using, for example, a selective dry or wet etch process.

Figures 15A, 15B, 15C:
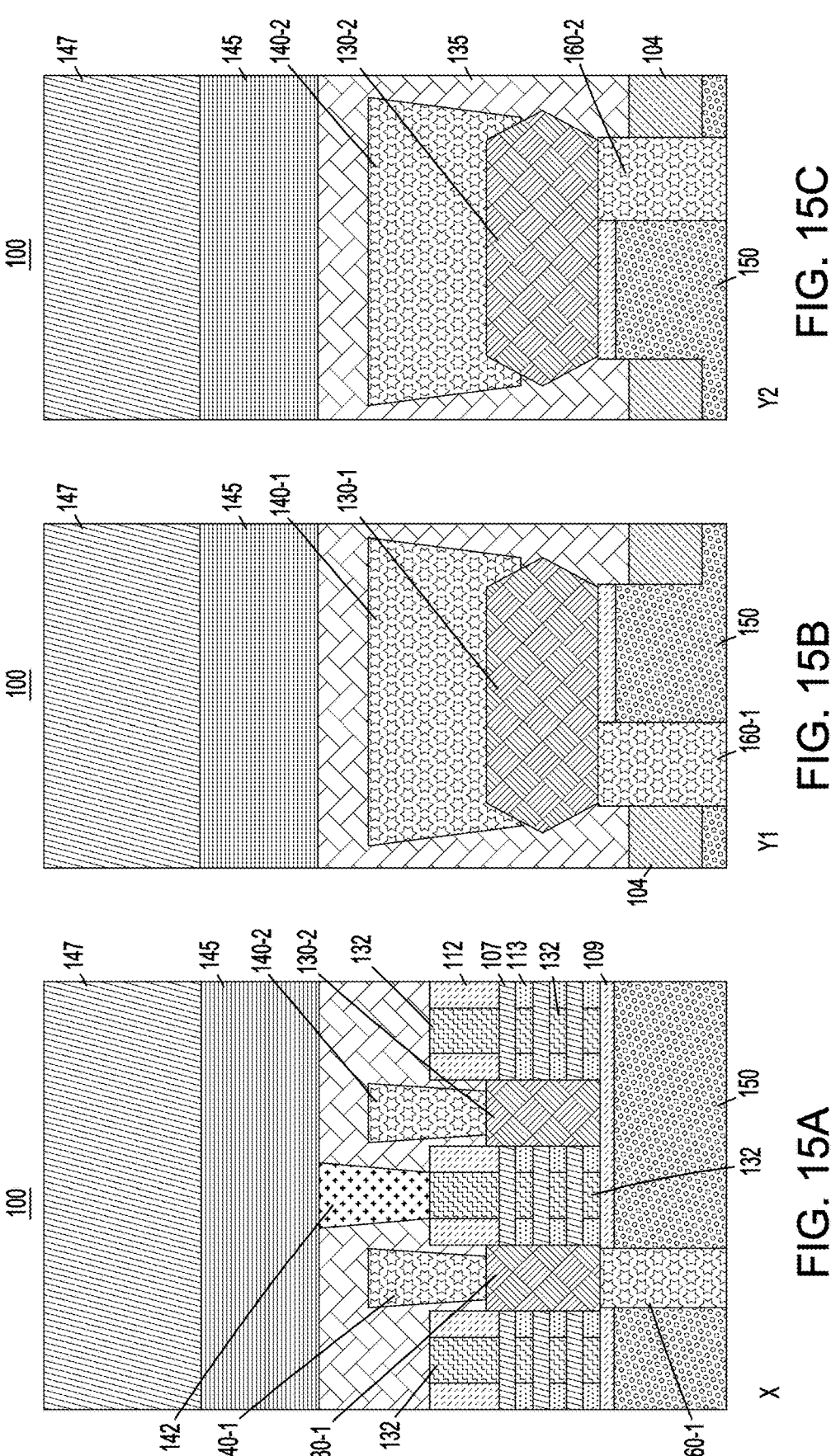
FIG. 15A depicts a first cross-sectional view corresponding to the line X in FIG. 3 following backside contact formation, according to an embodiment of the invention.
FIG. 15B depicts a second cross-sectional view corresponding to the line Y1 in FIG. 3 following backside contact formation, according to an embodiment of the invention.
FIG. 15C depicts a third cross-sectional view corresponding to the line Y2 in FIG. 3 following backside contact formation, according to an embodiment of the invention.

Referring to FIGS. 15A-15C, the backside source/drain contacts 160-1 and 160-2 are formed in the backside ILD layer 150 in the openings left by the removal of the sacrificial placeholder layers 125-1 and 125-2. Metal layers are deposited in the openings to form the backside source/drain contacts 160-1 and 160-2. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, chemical mechanical planarization (CMP) to remove excess portions of the metal layers from on top of the backside ILD layer 150.

The backside source/drain contacts 160-1 and 160-2 contact respective backsides of the source/drain regions 130-1 and 130-2. The backside source/drain contacts 160-1 and 160-2 extend through the backside ILD layer 150 to land on and contact the backsides of the corresponding source/drain regions 130-1 and 130-2.

Figures 16A, 16B, 16C:
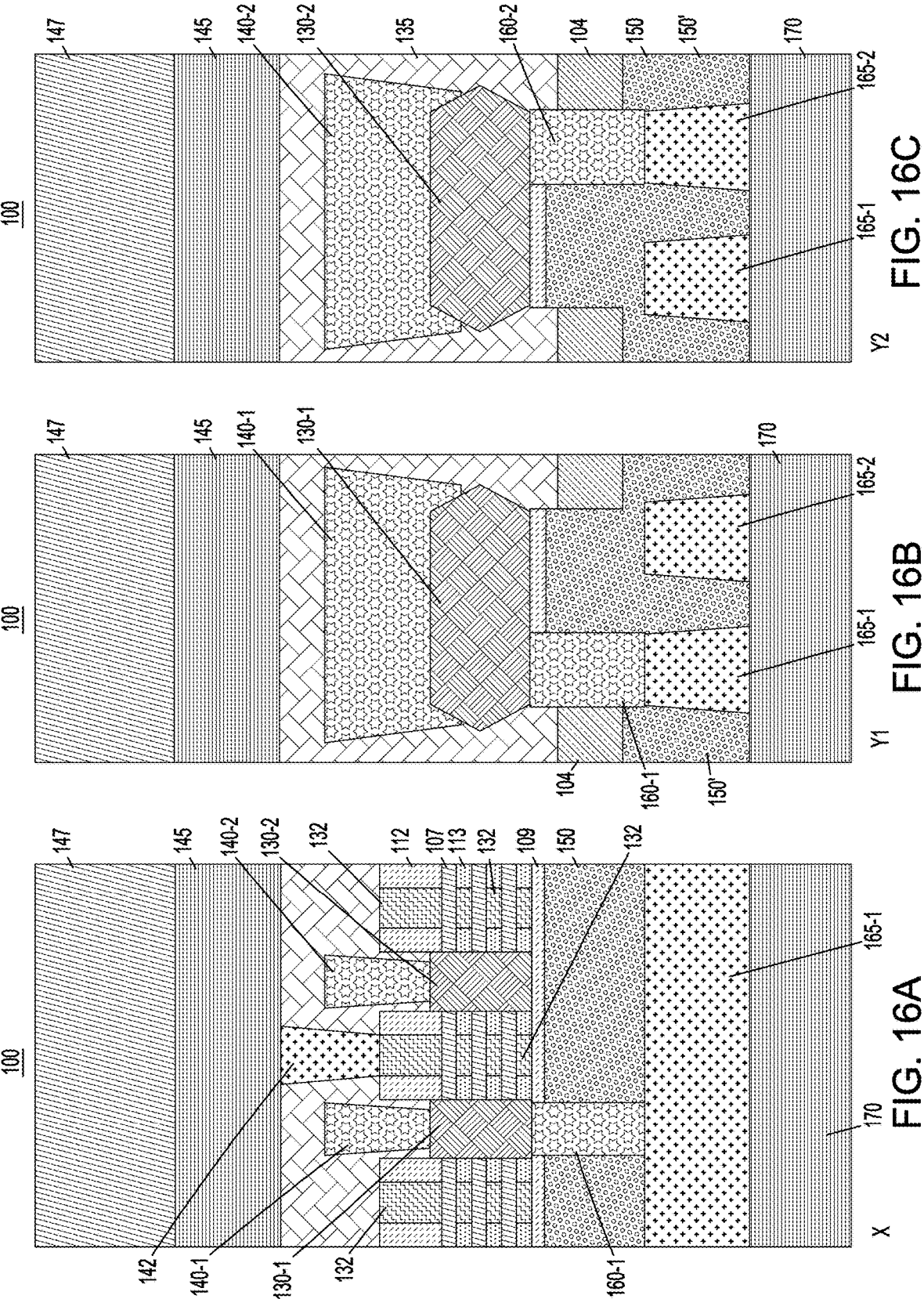
FIG. 16A depicts a first cross-sectional view corresponding to the line X in FIG. 3 following backside power rail and interconnect formation, according to an embodiment of the invention.
FIG. 16B depicts a second cross-sectional view corresponding to the line Y1 in FIG. 3 following backside power rail and interconnect formation, according to an embodiment of the invention.
FIG. 16C depicts a third cross-sectional view corresponding to the line Y2 in FIG. 3 following backside power rail and interconnect formation, according to an embodiment of the invention.

Referring to FIGS. 16A-16C, additional backside ILD material is deposited to form an additional backside ILD layer 150' on the backside ILD layer 150. Then, conductive wires 165-1 (Vdd) and 165-2 (Vdd core) are formed in the backside ILD layer 150'. The conductive wires 165-1 and 165-2 are also referred to herein as backside power rails. In forming the conductive wires 165-1 and 165-2, openings are formed through portions of the additional backside ILD layer 150'. The openings expose portions the backside source/drain contacts 160-1 and 160-2 on which the conductive wires 165-1 and 165-2 are to be formed.

The conductive wires 165-1 and 165-2, also referred to herein as power elements or backside power rails, are formed in the additional backside ILD layer 150' by forming trenches in the additional backside ILD layer 150' and filling the trenches with conductive material. Trenches are respectively opened in the additional backside ILD layer 150' using, for example, lithography followed by RIE. The conductive wires 165-1 and 165-2 are formed in the trenches by filling the trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

The conductive wire 165-1 delivers, for example, a supply or drain voltage (Vdd) to source/drain region 130-1 (e.g., an input source/drain region) through backside source/drain contact 160-1. The conductive wire 165-2 delivers, for example, a core supply voltage (Vdd_core) to source/drain region 130-2 (e.g., an output source/drain region) through backside source/drain contact 160-2.

As can be seen in FIGS. 16A-16C, the backside source/drain contact 160-1 contacts the source/drain region 130-1, and the conductive wire 165-1 is formed on and contacts the backside source/drain contact 160-1. The backside source/drain contact 160-2 contacts the source/drain region 130-2, and the conductive wire 165-2 is formed on and contacts the backside source/drain contact 160-2. The backside ILD layer 150 and the additional backside ILD layer 150' fill in the vacant areas on lateral sides of the backside source/drain contacts 160-1 and 160-2, and on lateral sides of the conductive wires 165-1 and 165-2. The backside source/drain contacts 160-1 and 160-2 are adjacent and contact dielectric layers 104. Referring back to FIG. 3, the backside source/drain contacts 160-1 and 160-2 are each self-aligned with one edge of the active area (e.g., source/drain regions 130-1 and 130-2.

Backside power delivery network (BSPDN) layers 170 (also referred to herein as backside interconnects) are formed on the additional backside ILD layer 150' and on the conductive wires 165-1 and 165-2. The BSPDN layers 170 include various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

Figure 17C:
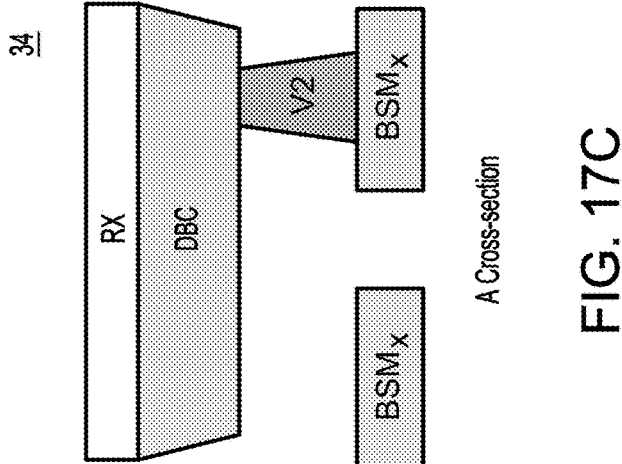
FIG. 17C depicts a cross-sectional view taken along the line A in FIG. 17B, according to an embodiment of the invention.
Figure 17A:
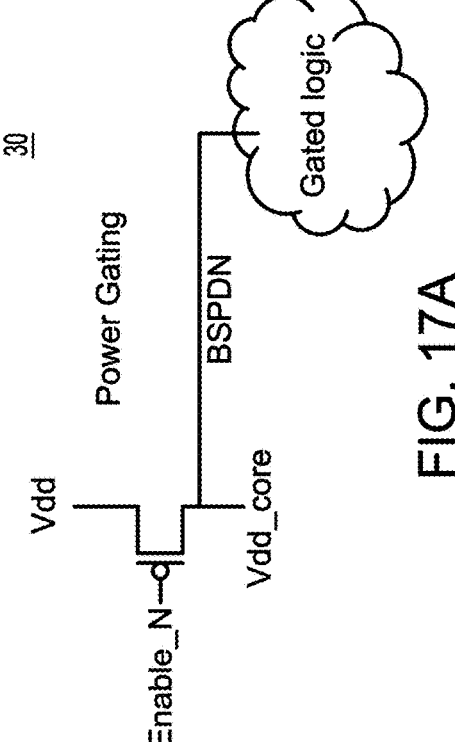
FIG. 17A depicts a circuit diagram illustrating a transistor structure with backside power distribution, according to an embodiment of the invention.

FIG. 17A depicts a circuit diagram 30 illustrating a transistor structure with backside power distribution. The circuit diagram 30 in FIG. 17A is the same as the circuit diagrams 10 and 20 in FIGS. 1A and 2A and is shown as reference for the transistor structure 32 in FIG. 17B. Similar to the transistor structure 12 and 22, the transistor structure 32 corresponds to the circuit diagram 30. The transistor structure 32 is similar to the transistor structure 22, except that the frontside source/drain contacts have been omitted, direct backside contacts (DBCs) extend to be self-aligned with multiple edges of an active area and vias V1 and V2 connect the direct backside contacts (DBCs) to the conductive wires. In more detail, referring to FIG. 17C, which is a cross-sectional view 34 taken along the line A in FIG. 17B, a DBC extends the entire width of an active area (RX) (e.g., source/drain region) and a via V2 connects the direct backside contact (DBCs) to a backside metallization layer (BSMx) through a conductive wire (e.g., power rail) (not shown).

Figure 17B:
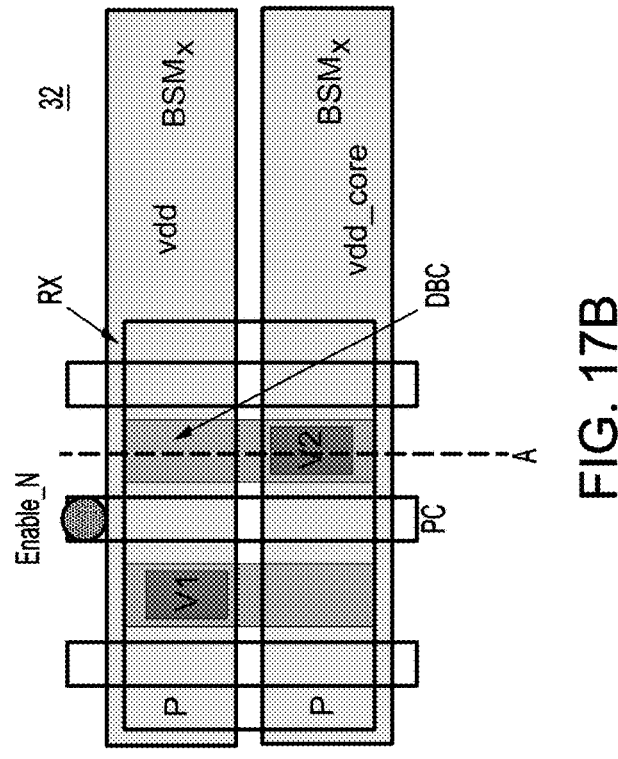
FIG. 17B depicts a top view of a transistor structure in accordance with the circuit diagram of FIG. 1A with source/drain regions of merged transistors connected to common backside contacts, according to an embodiment of the invention.
Figure 18:
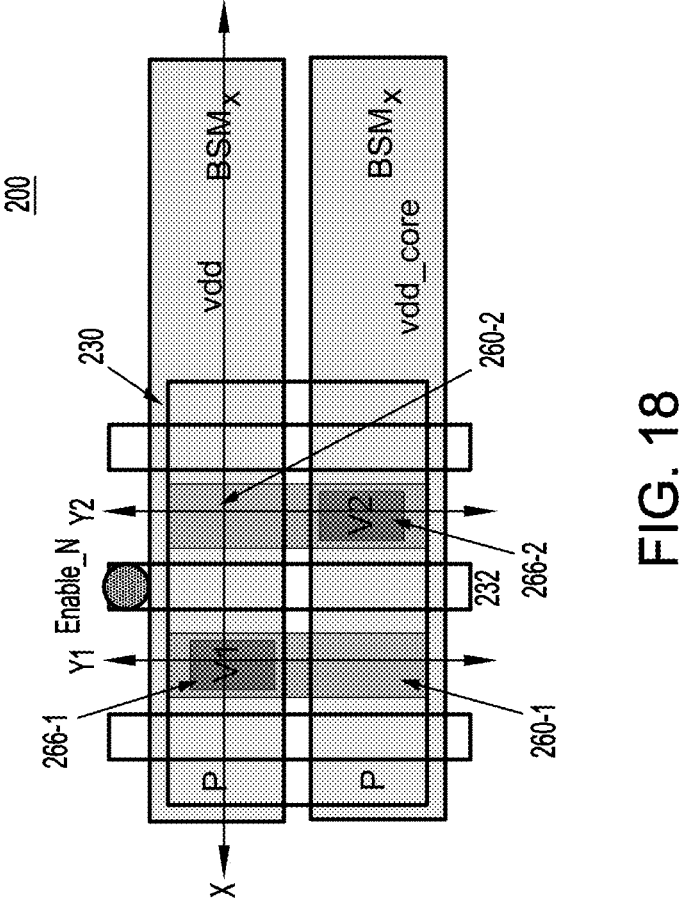
FIG. 18 depicts the top view of FIG. 17B with lines X, Y1 and Y2 on which the cross-sectional views of FIGS. 19A-31C are based, according to an embodiment of the invention.
Figure 19C:
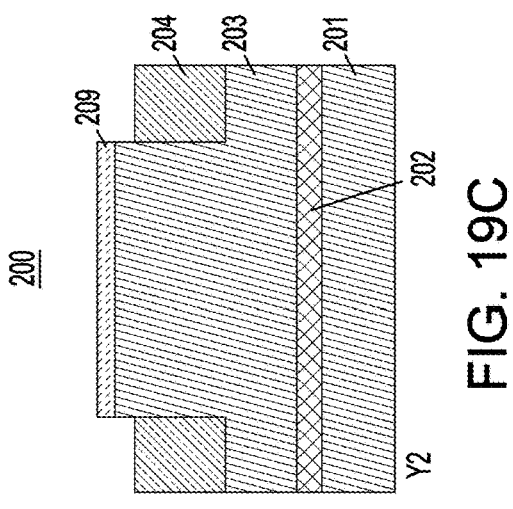
FIG. 19C depicts a third cross-sectional view corresponding to the line Y2 in FIG. 18 following inner spacer formation, according to an embodiment of the invention.
Figure 19B:
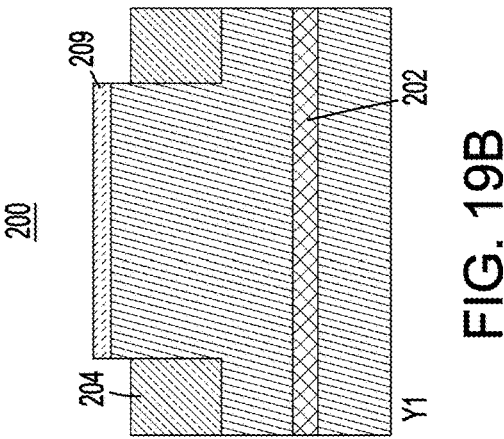
FIG. 19B depicts a second cross-sectional view corresponding to the line Y1 in FIG. 18 following inner spacer formation, according to an embodiment of the invention.
Figure 19A:
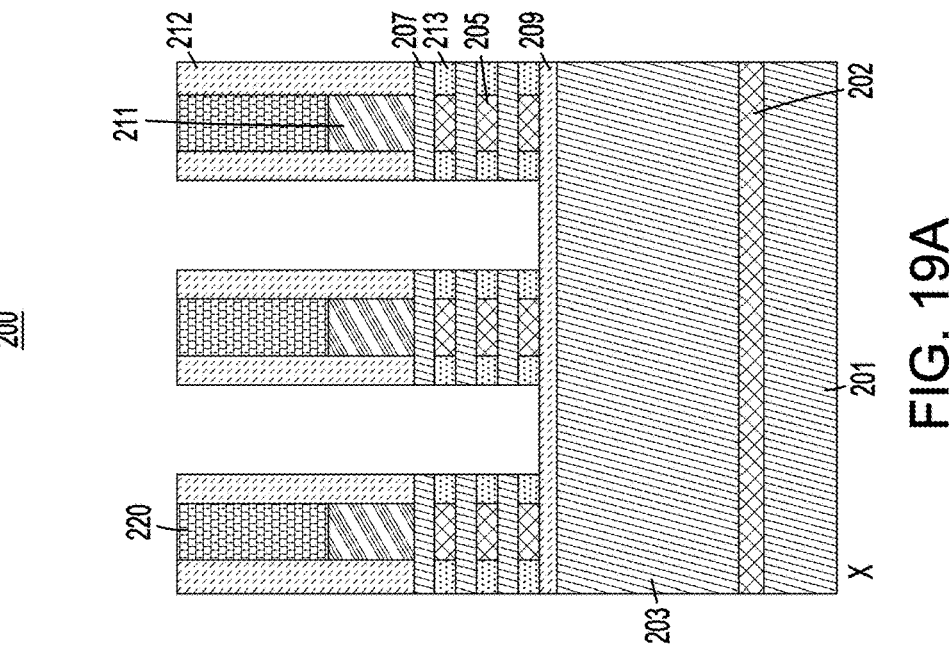
FIG. 19A depicts a first cross-sectional view corresponding to the line X in FIG. 18 following inner spacer formation, according to an embodiment of the invention.

For a semiconductor structure 200, FIG. 18 depicts the top view of FIG. 17B with lines X, Y1 and Y2 on which the cross-sectional views of FIGS. 19A-31C are based, according to an embodiment of the invention. The reference numbers in FIGS. 19A-31C that are similar to the reference numbers in FIGS. 4A-16C (e.g., begin with "2" instead of "1") illustrate the same or similar elements as those in FIGS. 4A-16C. For example, FIGS. 19A-19C illustrate the same processing and configuration as that of semiconductor structure 100 in FIGS. 4A-4C for a semiconductor structure 200. In more detail, first and second semiconductor substrates 201 and 203 and etch stop layer 202 are the same as or similar to first and second semiconductor substrates 101 and 103 and etch stop layer 102.

Like the processing in FIGS. 4B and 4C, in FIGS. 19B and 19C, portions of the second semiconductor substrate 203 are recessed to a lower height, and a dielectric layer 204 fills in the recessed portions of the second semiconductor substrate 203 to form a plurality of isolation regions (e.g., shallow trench isolation (STI) regions). In accordance with an embodiment of the present invention, like dielectric layer 109, a dielectric layer 209 (also referred to as a BDI layer) is formed on the second semiconductor substrate 203. Like the SiGe layers 105 and Si layers 107, the semiconductor structure 200 includes nanosheet stacks comprising SiGe layers 205 and Si layers 207.

The semiconductor structure 200 further includes dummy gate portions 211 formed on the uppermost Si layers 207 and around the stacked nanosheet configurations of the SiGe layers 205 and Si layers 207. The dummy gate portions 211 are the same or similar to the dummy gate portions 111 of the semiconductor structure 100. Like the hardmask layers 120, hardmask layers 220 are formed on the dummy gate portions 211. Referring to FIG. 19A, like the gate spacers 112 and inner spacers 113 of the semiconductor structure 100, the semiconductor structure 200 includes gate spacers 212 and inner spacers 213.

Figure 20C:
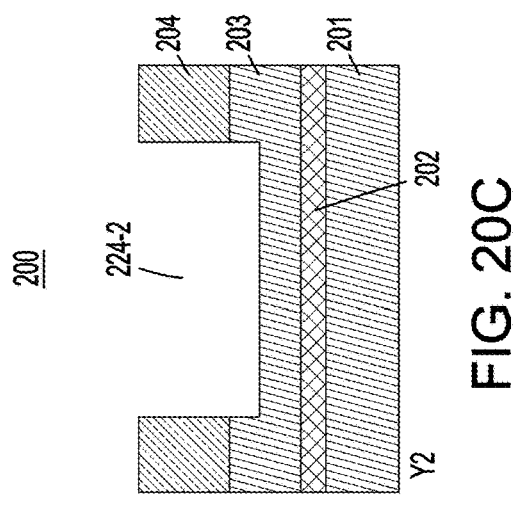
FIG. 20C depicts a third cross-sectional view corresponding to the line Y2 in FIG. 18 following protective spacer formation, BDI removal and silicon layer recessing, according to an embodiment of the invention.
Figure 20B:
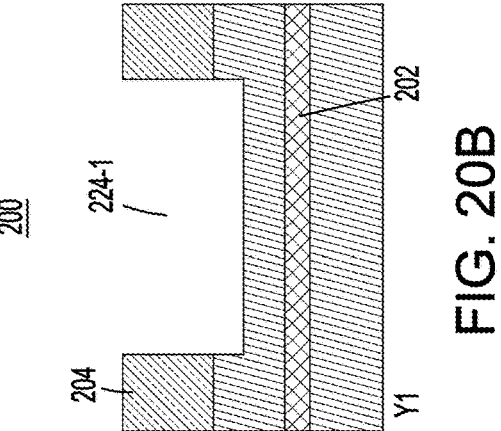
FIG. 20B depicts a second cross-sectional view corresponding to the line Y1 in FIG. 18 following protective spacer formation, BDI removal and silicon layer recessing, according to an embodiment of the invention.
Figure 20A:
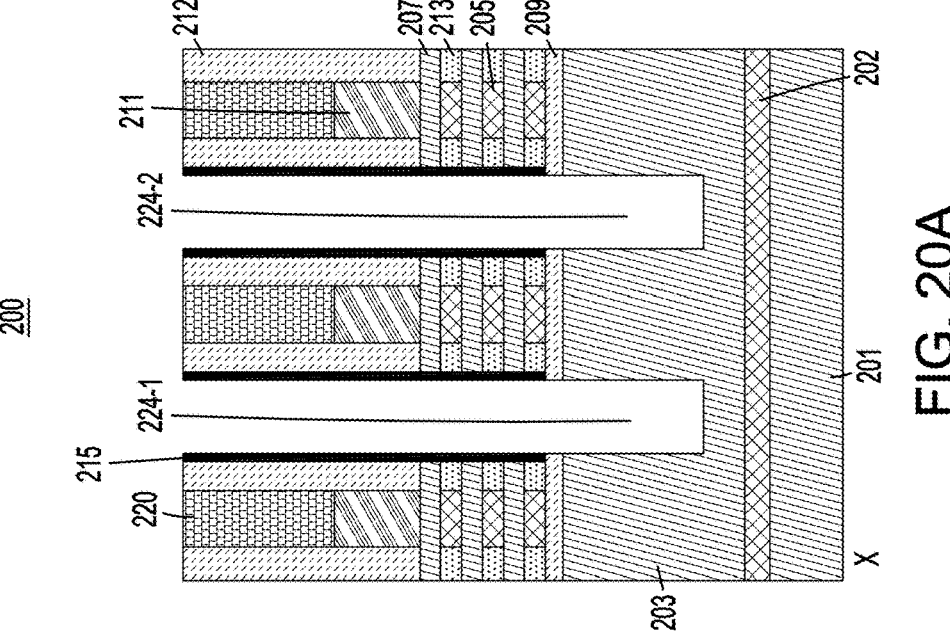
FIG. 20A depicts a first cross-sectional view corresponding to the line X in FIG. 18 following protective spacer formation, bottom dielectric insulator (BDI) removal and silicon layer recessing, according to an embodiment of the invention.

Referring to FIGS. 20A-20C, like the protective spacers 115, protective spacers 215 are formed on sides of the nanosheet stacks including the Si layers 207, gate spacers 212 and inner spacers 213. Following formation of the protective spacers 215, exposed portions of the dielectric layer 209 and underlying portions of the second semiconductor substrate 203 are removed to form openings 224-1 and 224-2 corresponding to where backside source/drain contacts 260-1 and 260-2 (see FIGS. 29A-31C) are to be formed. An etching process such as, for example, RIE, is performed to form the openings 224-1 and 224-2 (e.g., trenches) in the second semiconductor substrate 203. The openings 224-1 and 224-2 are formed by etching through part of dielectric layer 209 and part of the second semiconductor substrate 203.

Figures 21A, 21B, 21C:
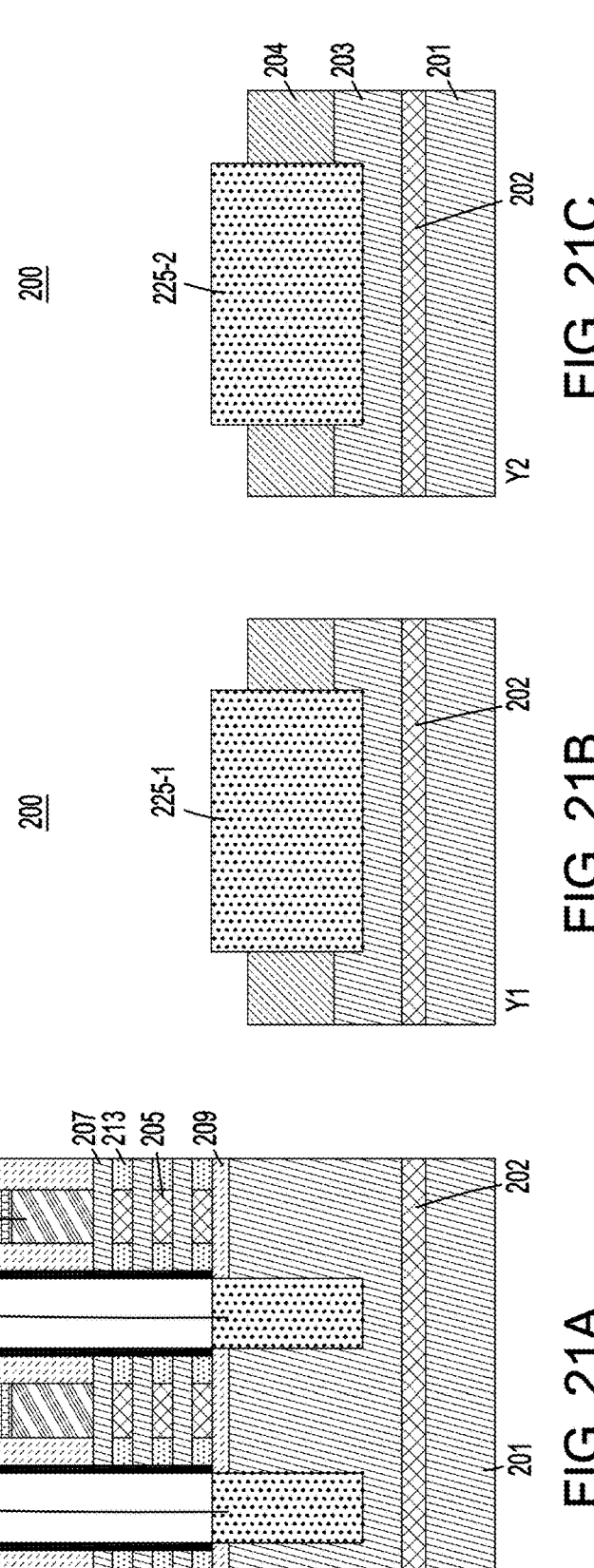
FIG. 21A depicts a first cross-sectional view corresponding to the line X in FIG. 18 following sacrificial layer formation, according to an embodiment of the invention.
FIG. 21B depicts a second cross-sectional view corresponding to the line Y1 in FIG. 18 following sacrificial layer formation, according to an embodiment of the invention.
FIG. 21C depicts a third cross-sectional view corresponding to the line Y2 in FIG. 18 following sacrificial layer formation, according to an embodiment of the invention.

Referring to FIGS. 21A-21C, the openings 224-1 and 224-2 are filled with sacrificial placeholder layers 225-1 and 225-2 comprising, for example, SiGe, III-V semiconductor material or other semiconductor material. As can be seen in FIGS. 21B and 21C, the openings 224-1 and 224-2 and corresponding sacrificial placeholder layers 225-1 and 225-2 are wider than the openings 124-1 and 124-2 and corresponding sacrificial placeholder layers 125-1 and 125-2 of the semiconductor structure 100.

Figure 22C:
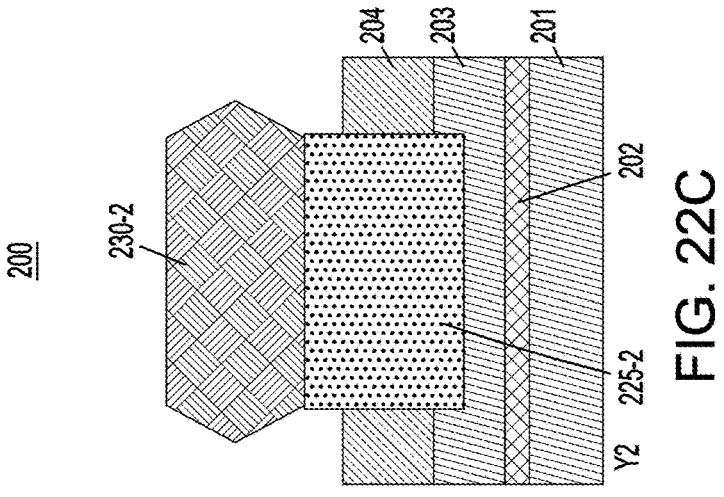
FIG. 22C depicts a third cross-sectional view corresponding to the line Y2 in FIG. 18 following protective spacer removal and source/drain region formation, according to an embodiment of the invention.
Figure 22B:
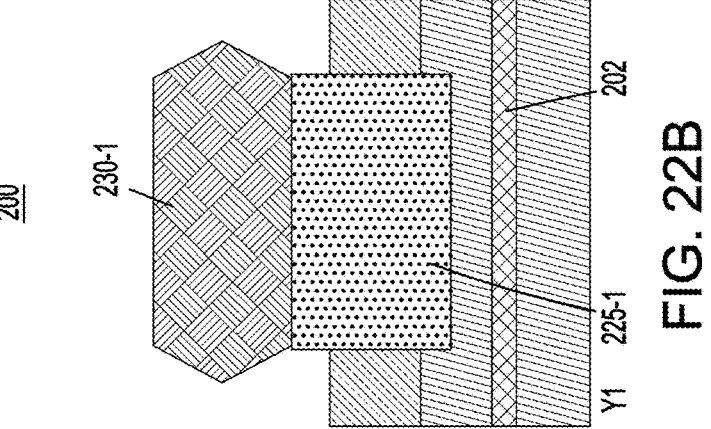
FIG. 22B depicts a second cross-sectional view corresponding to the line Y1 in FIG. 18 following protective spacer removal and source/drain region formation, according to an embodiment of the invention.
Figure 22A:
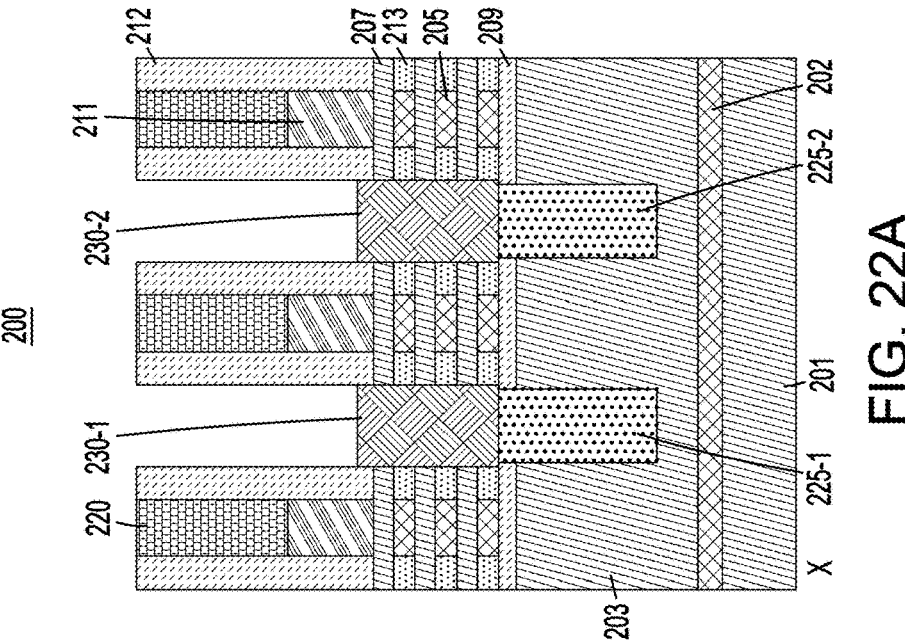
FIG. 22A depicts a first cross-sectional view corresponding to the line X in FIG. 18 following protective spacer removal and source/drain region formation, according to an embodiment of the invention.

Referring to FIGS. 22A-22C, the protective spacers 215 are removed using, for example, an isotropic dry or wet etch process, and source/drain regions 230-1 and 230-2 are epitaxially grown between the nanosheet stacks. The source/drain regions 230-1 and 230-2 comprise epitaxial layers grown from sides of Si layers 207. The Si layers 207 will function as the nanosheet channel layers. As can be seen, the source/drain regions 230-1 and 230-2 are formed on entire top surfaces the sacrificial placeholder layers 225-1 and 225-2.

Figures 23A, 23B, 23C:
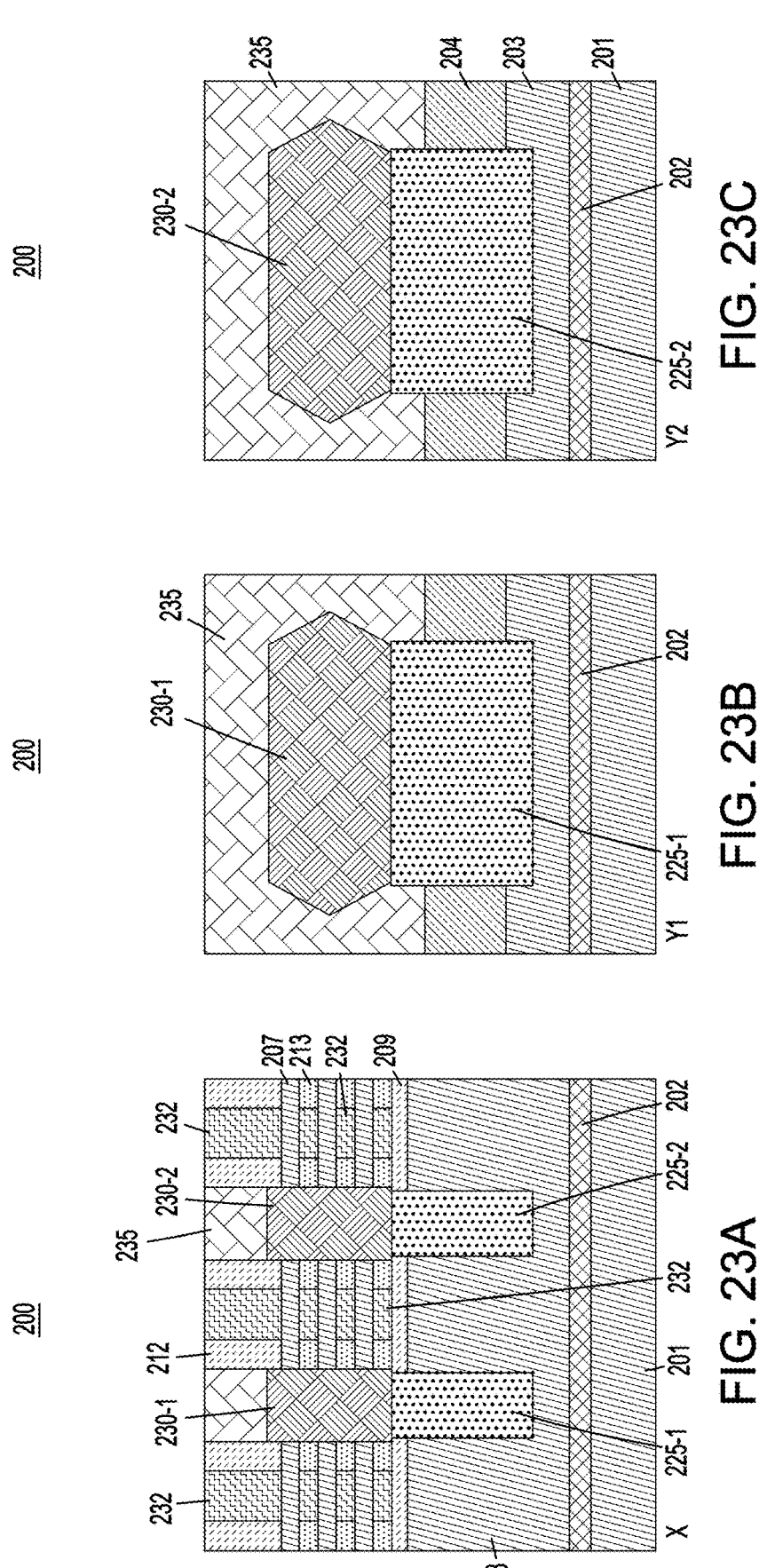
FIG. 23A depicts a first cross-sectional view corresponding to the line X in FIG. 18 following ILD layer and RMG formation, according to an embodiment of the invention.
FIG. 23B depicts a second cross-sectional view corresponding to the line Y1 in FIG. 18 following ILD layer and RMG formation, according to an embodiment of the invention.
FIG. 23C depicts a third cross-sectional view corresponding to the line Y2 in FIG. 18 following ILD layer and RMG formation, according to an embodiment of the invention.

Referring to FIGS. 23A-23C, an ILD layer 235 is deposited to fill in portions on and around the source/drain regions 230-1 and 230-2. The ILD layer 235 comprises the same or similar material as the ILD layer 135, and is deposited using the same or similar deposition techniques as used for the ILD layer 135, followed by a planarization process, such as, CMP to remove excess portions of the ILD layer 135 deposited on top of the hardmask layers 220 and gate spacers 212, and to remove the hardmask layers 220 and portions of the gate spacers 212 to expose the dummy gate portions 211. Similar to the RMG process discussed in connection with FIGS. 8A-8C, the dummy gate portions 211 and SiGe layers 205 are selectively removed and replaced with gate regions 232 (also referred to herein as gate structures). The gate regions 232 can be the same or similar to the gate regions 132.

Figures 24A, 24B, 24C:
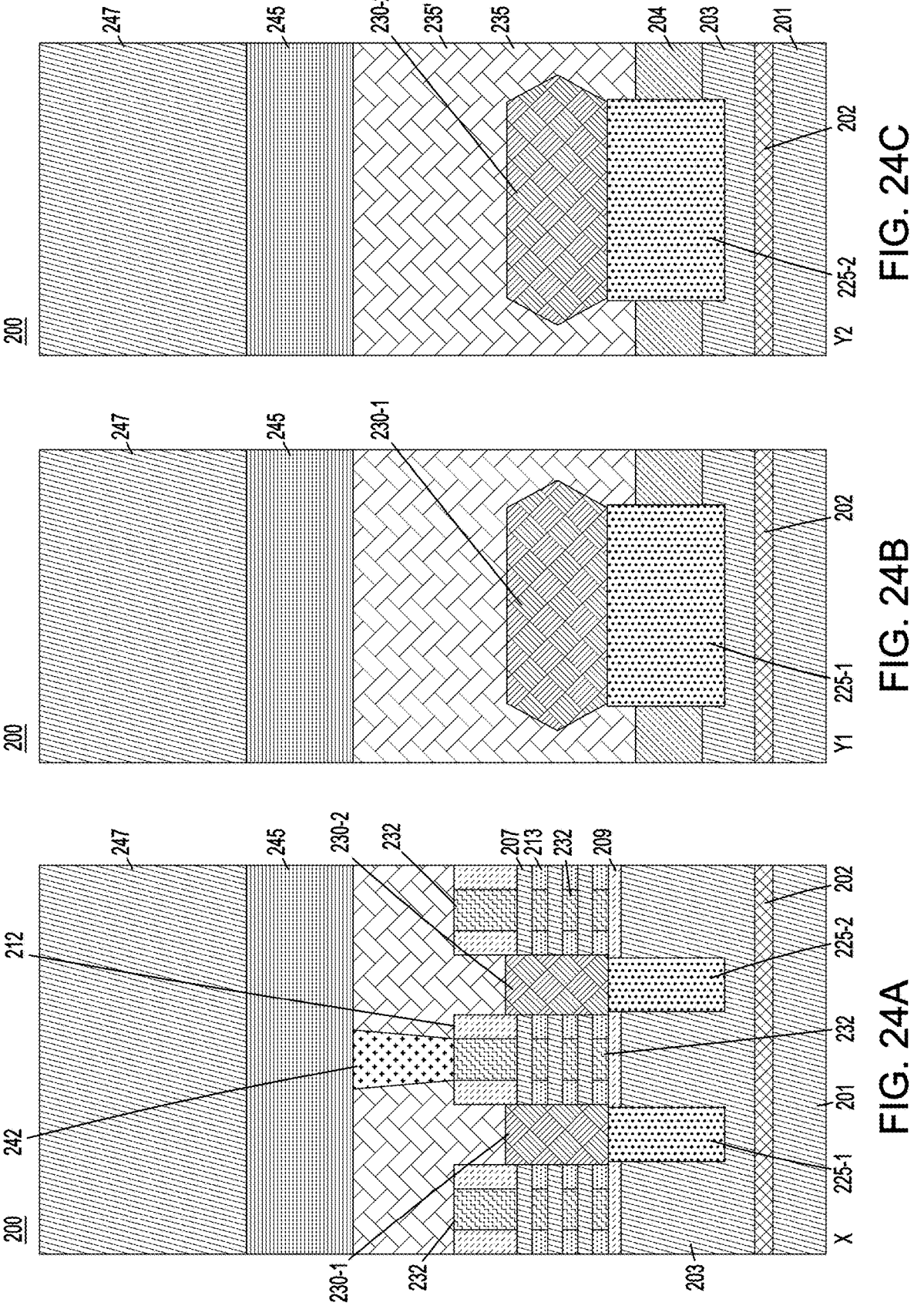
FIG. 24A depicts a first cross-sectional view corresponding to the line X in FIG. 18 following MOL and BEOL interconnect formation and carrier wafer bonding, according to an embodiment of the invention.
FIG. 24B depicts a second cross-sectional view corresponding to the line Y1 in FIG. 18 following MOL and BEOL interconnect formation and carrier wafer bonding, according to an embodiment of the invention.
FIG. 24C depicts a third cross-sectional view corresponding to the line Y2 in FIG. 18 following MOL and BEOL interconnect formation and carrier wafer bonding, according to an embodiment of the invention.

Referring to FIGS. 24A-24C, additional ILD material is deposited to form an additional ILD layer 235' on top of the ILD layer 235. The semiconductor structure 200 does not include frontside source/drain contacts. Similar to the frontside gate contact 142, a frontside gate contact 242 is formed through the ILD layer 235' to land on and contact a corresponding gate region 232. The process and materials used for forming the frontside gate contact 242 are similar to those used for forming the frontside source/drain contacts 140-1 and 140-2 in the semiconductor structure 100. Frontside BEOL interconnects 245 are formed on the ILD layer 235' including the frontside gate contact 242. As can be seen, the frontside gate contact 242 contacts the frontside BEOL interconnects 245. A carrier wafer 247 is bonded to the frontside BEOL interconnects 245. The frontside BEOL interconnects 245 include various BEOL interconnect structures which may electrically connect to the frontside gate contact 242. The carrier wafer 247 may be formed of materials similar to that of the first and second semiconductor substrates 201 and 203, and may be formed over the frontside BEOL interconnects 245 using a wafer bonding process, such as dielectric-to-dielectric bonding.

Figures 25A, 25B, 25C:
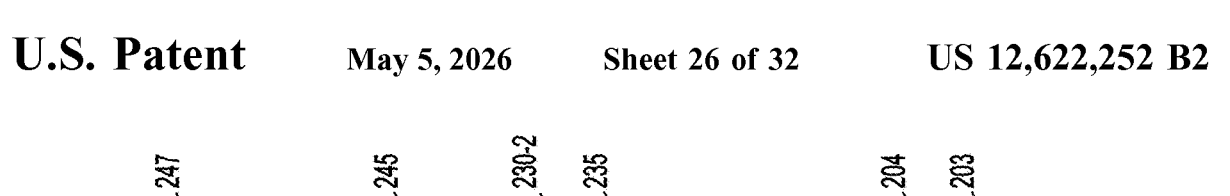
FIG. 25A depicts a first cross-sectional view corresponding to the line X in FIG. 18 following substrate removal, according to an embodiment of the invention.
FIG. 25B depicts a second cross-sectional view corresponding to the line Y1 in FIG. 18 following substrate removal, according to an embodiment of the invention.
FIG. 25C depicts a third cross-sectional view corresponding to the line Y2 in FIG. 18 following substrate removal, according to an embodiment of the invention.

Referring to FIGS. 25A-25C, using the carrier wafer 247, the semiconductor structure 200 may be "flipped" (e.g., rotated 180 degrees) so that the structure is inverted. In addition, the first semiconductor substrate 201 is removed from the backside of the semiconductor structure 200. The removal process, which comprises etching of the first semiconductor substrate 201, stops at the etch stop layer 202 as illustrated in FIGS. 25A-25C. For example, the first semi-conductor substrate 201 is selectively etched with an etchant that selectively etches silicon with respect to a material of the etch stop layer 202 (e.g., $SiO_2$ or SiGe).

Figures 26A, 26B, 26C:
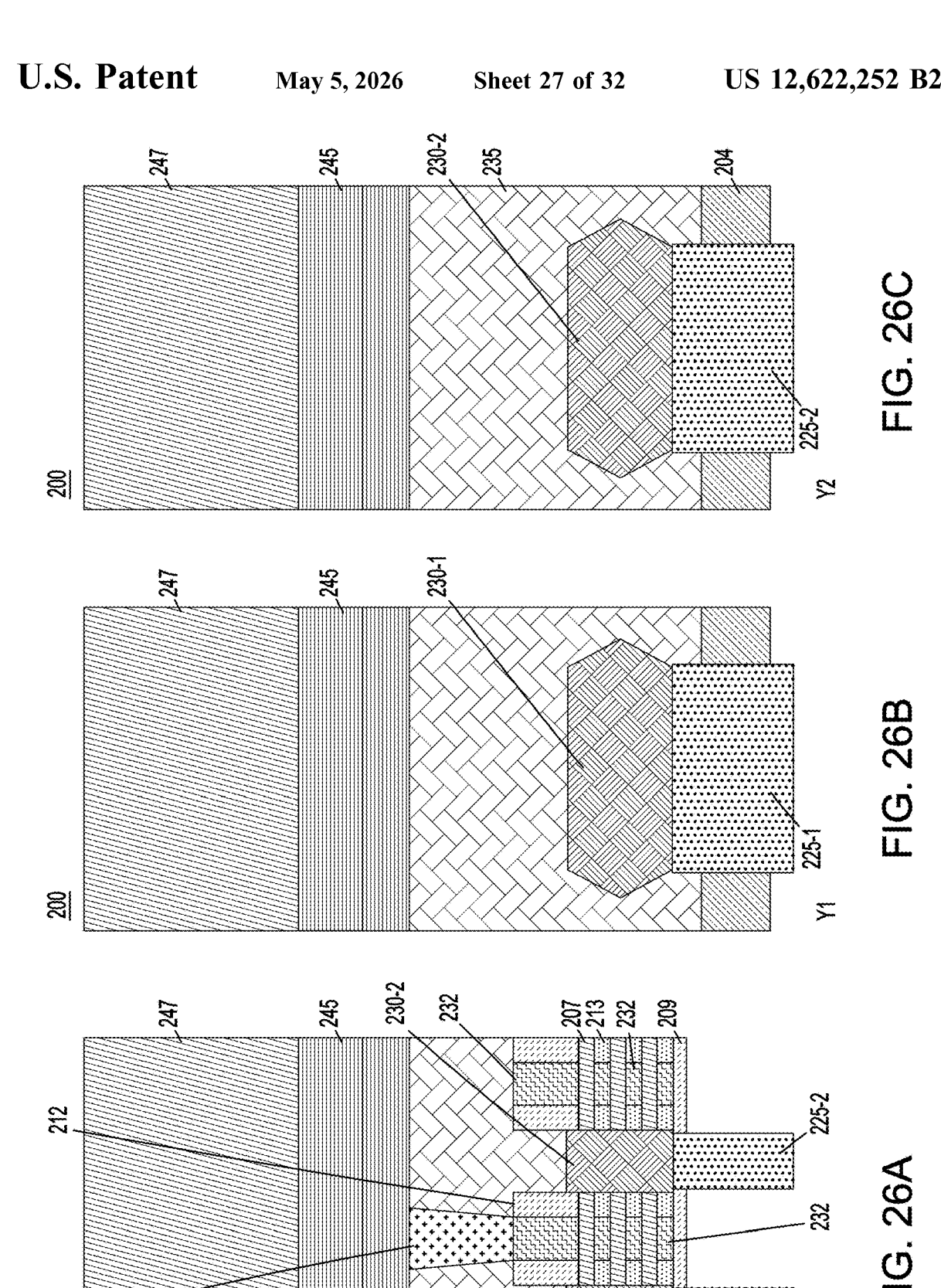
FIG. 26A depicts a first cross-sectional view corresponding to the line X in FIG. 18 following etch stop and silicon layer removal, according to an embodiment of the invention.
FIG. 26B depicts a second cross-sectional view corresponding to the line Y1 in FIG. 18 following etch stop and silicon layer removal, according to an embodiment of the invention.
FIG. 26C depicts a third cross-sectional view corresponding to the line Y2 in FIG. 18 following etch stop and silicon layer removal, according to an embodiment of the invention.

Referring to FIGS. 26A-26C, the etch stop layer 202 and the second semiconductor substrate 203 (e.g., silicon layer) are selectively removed from the semiconductor structure 200 with respect to the sacrificial placeholder layers 225-1 and 225-2 and the dielectric layers 204 (e.g., STI regions). As shown in FIGS. 26A-26C, the etch stop layer 202 is removed, followed by removal of the second semiconductor substrate 203, wherein portions of the dielectric layers 204, dielectric layer 209, and the sacrificial placeholder layers 225-1 and 225-2 are exposed. Etching processes for removal of the etch stop layer 202 include, for example, IBE by Ar/CHF3 based chemistry.

Figures 27A, 27B, 27C:
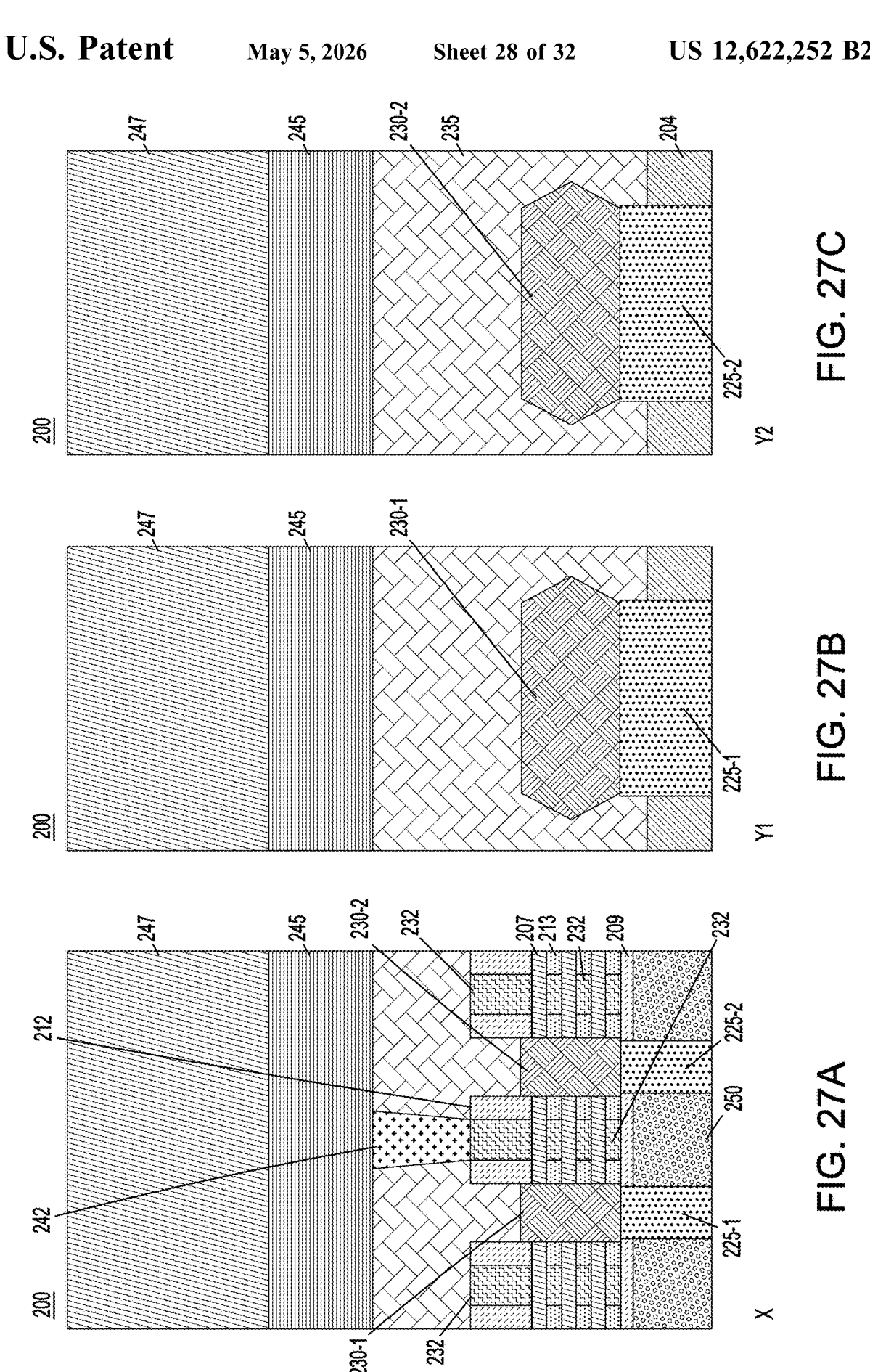
FIG. 27A depicts a first cross-sectional view corresponding to the line X in FIG. 18 following backside ILD layer formation and planarization, according to an embodiment of the invention.
FIG. 27B depicts a second cross-sectional view corresponding to the line Y1 in FIG. 18 following backside ILD layer formation and planarization, according to an embodiment of the invention.
FIG. 27C depicts a third cross-sectional view corresponding to the line Y2 in FIG. 18 following backside ILD layer formation and planarization, according to an embodiment of the invention.

Referring to FIGS. 27A-27C, a backside ILD layer 250 is deposited to fill in areas formerly occupied by the second semiconductor substrate 203. The backside ILD layer 250 is formed from the same or similar materials and processes for forming the backside ILD layer 150 of semiconductor structure 100. In an illustrative embodiment, the backside ILD layer 250 is coplanar with surfaces of the sacrificial placeholder layers 225-1 and 225-2. The surfaces of the sacrificial placeholder layers 225-1 and 225-2 are exposed following a CMP process.

Figures 28A, 28B, 28C:
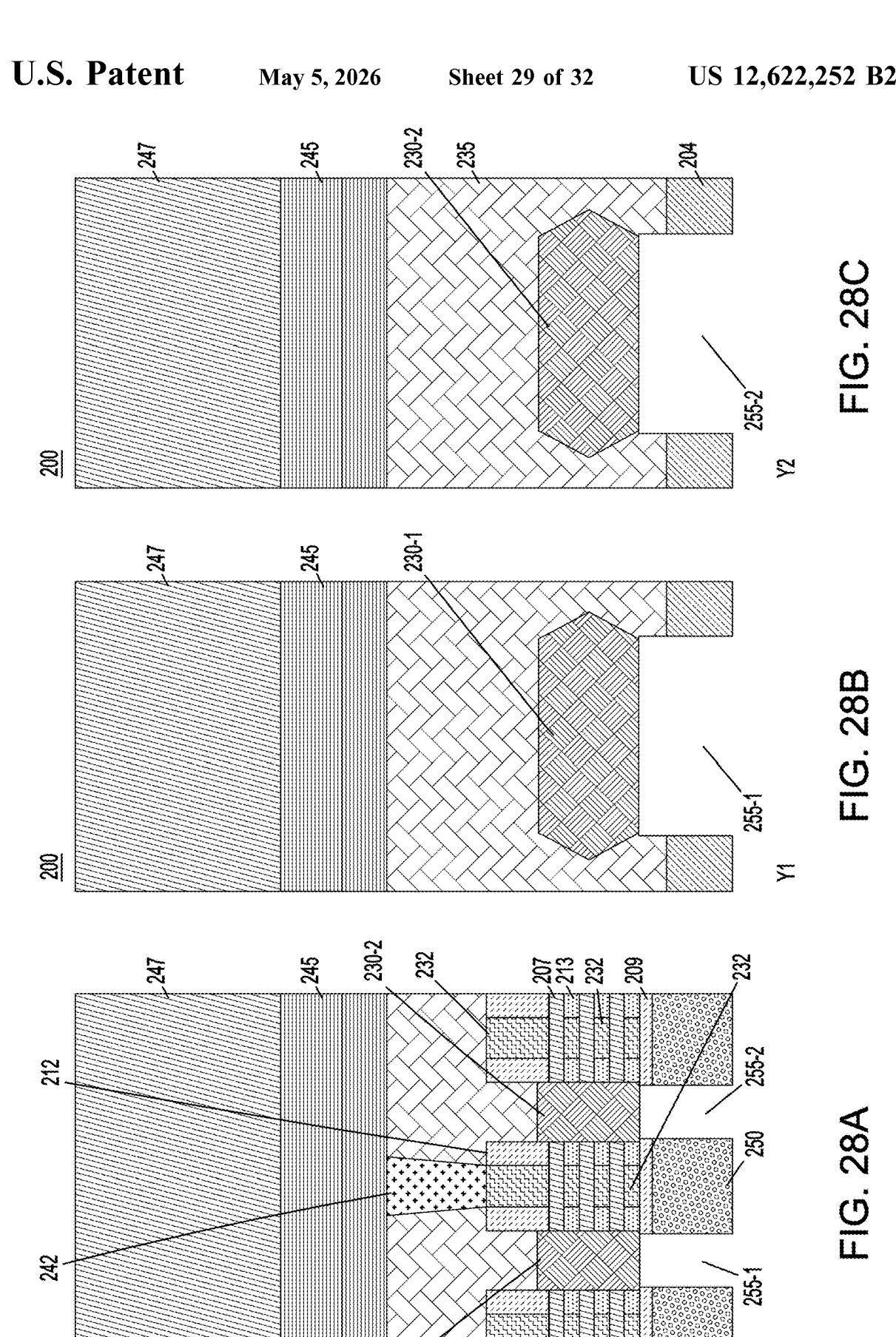
FIG. 28A depicts a first cross-sectional view corresponding to the line X in FIG. 18 following sacrificial layer removal, according to an embodiment of the invention.
FIG. 28B depicts a second cross-sectional view corresponding to the line Y1 in FIG. 18 following sacrificial layer removal, according to an embodiment of the invention.
FIG. 28C depicts a third cross-sectional view corresponding to the line Y2 in FIG. 18 following sacrificial layer removal, according to an embodiment of the invention.

Referring to FIGS. 28A-28C, the sacrificial placeholder layers 225-1 and 225-2 are selectively removed to expose backside portions of the source/drain regions 230-1 and 230-2. The sacrificial placeholder layers 225-1 and 225-2 are removed using, for example, a selective dry or wet etch process.

Figures 29A, 29B, 29C:
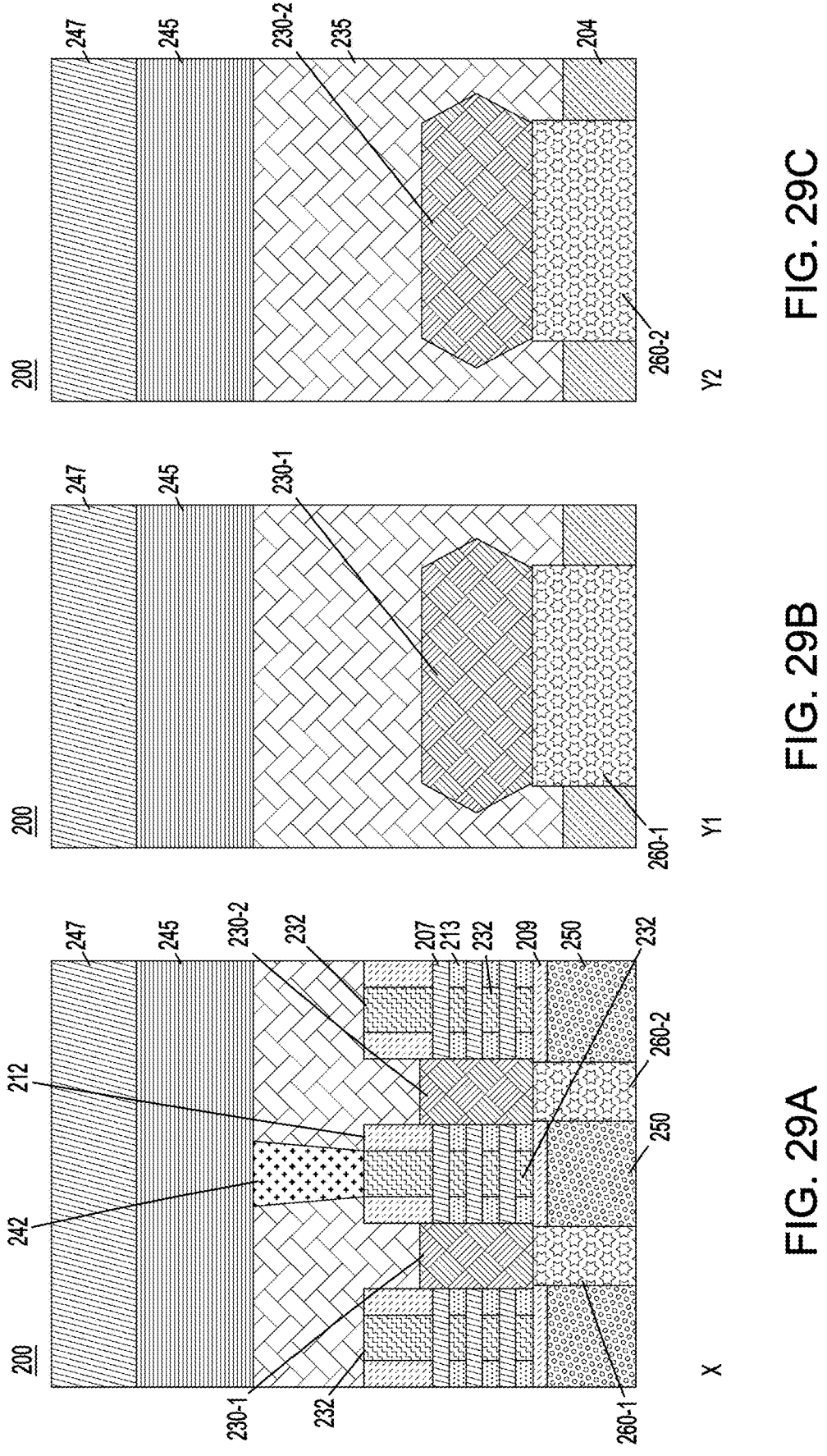
FIG. 29A depicts a first cross-sectional view corresponding to the line X in FIG. 18 following backside contact formation, according to an embodiment of the invention.
FIG. 29B depicts a second cross-sectional view corresponding to the line Y1 in FIG. 18 following backside contact formation, according to an embodiment of the invention.
FIG. 29C depicts a third cross-sectional view corresponding to the line Y2 in FIG. 18 following backside contact formation, according to an embodiment of the invention.

Referring to FIGS. 29A-29C, the backside source/drain contacts 260-1 and 260-2 are formed in the backside ILD layer 250 and between the dielectric layers 204 in the openings left by the removal of the sacrificial placeholder layers 225-1 and 225-2. Metal layers are deposited in the openings to form the backside source/drain contacts 260-1 and 260-2. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, CMP to remove excess portions of the metal layers from on top of the backside ILD layer 250 and/or dielectric layers 204.

The backside source/drain contacts 260-1 and 260-2 contact respective backsides of the source/drain regions 230-1 and 230-2. In illustrative embodiments, the backside source/drain contacts 260-1 and 260-2 extend an entire width of the source/drain regions 230-1 and 230-2 to contact entire backside surfaces of the source/drain regions 230-1 and 230-2. Referring back to FIG. 18, the backside source/drain contacts 260-1 and 260-2 may be self-aligned with multiple edges of the source/drain regions 230-1 and 230-2. The backside source/drain contacts 260-1 and 260-2 extend through the backside ILD layer 250 and/or the dielectric layer 204 to land on and contact the backsides of the corresponding source/drain regions 230-1 and 230-2.

Figures 30A, 30B, 30C:
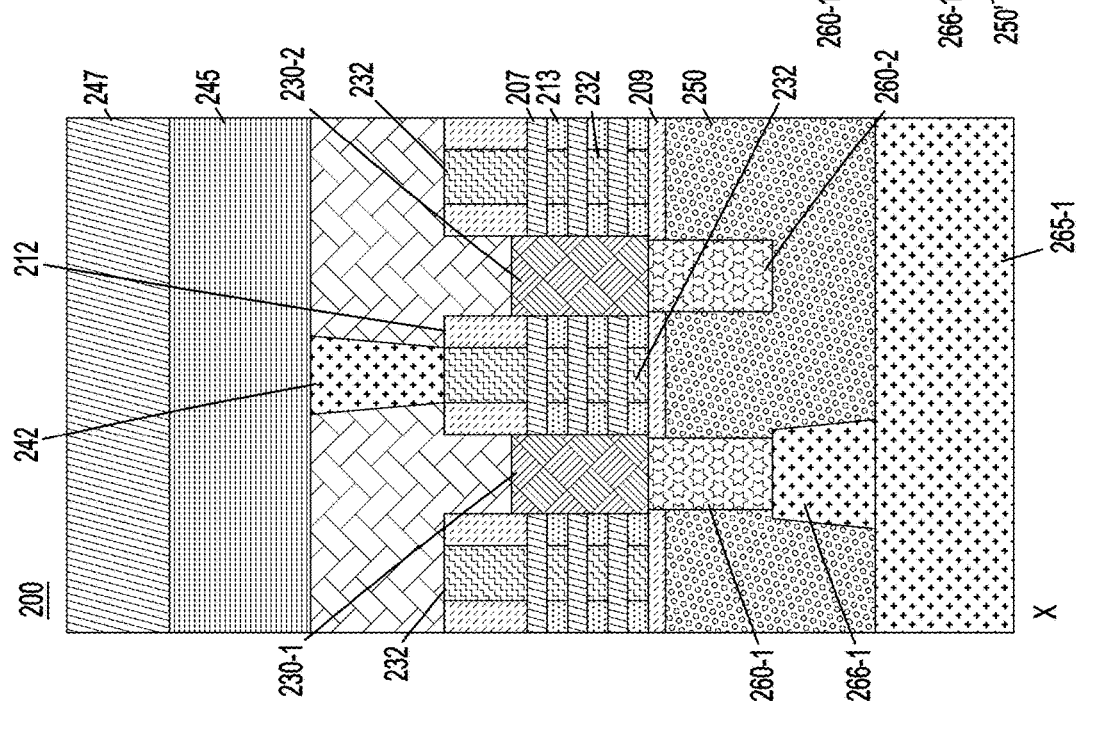
FIG. 30A depicts a first cross-sectional view corresponding to the line X in FIG. 18 following backside power rail and via formation, according to an embodiment of the invention.
FIG. 30B depicts a second cross-sectional view corresponding to the line Y1 in FIG. 18 following backside power rail and via formation, according to an embodiment of the invention.
FIG. 30C depicts a third cross-sectional view corresponding to the line Y2 in FIG. 18 following backside power rail and via formation, according to an embodiment of the invention.

Referring to FIGS. 30A-30C, additional backside ILD material is deposited to form an additional backside ILD layer 250' on the backside ILD layer 250. Then, conductive wires 265-1 (Vdd) and 265-2 (Vdd core), and vias 266-1 and 266-2 are formed in the backside ILD layer 250'. The via 266-1 is formed between the conductive wire 265-1 and the backside source/drain contact 260-1, and the via 266-2 is formed between the conductive wire 265-2 and the backside source/drain contact 260-2. The conductive wires 265-1 and 265-2 are also referred to herein as backside power rails. In forming the conductive wires 265-1 and 265-2, and vias 266-1 and 266-2, openings are formed through portions of the additional backside ILD layer 250'. The openings where the vias 266-1 and 266-2 are formed expose portions the backside source/drain contacts 260-1 and 260-2 on which the vias 266-1 and 266-2 are to be formed. In some locations, the conductive wires 265-1 and 265-2 are respectively formed on the vias 266-1 and 266-2 in openings exposing the backside surfaces of the vias 266-1 and 266-2. In other locations, portions of the conductive wires 265-1 and 265-1 are not formed and do not contact the vias 266-1 and 266-2.

The conductive wires 265-1 and 265-2, also referred to herein as power elements or backside power rails, are formed in the additional backside ILD layer 250' by forming trenches in the additional backside ILD layer 250' and filling the trenches with conductive material. Similarly, the vias 266-1 and 266-2 are formed in the additional backside ILD layer 250' by forming trenches in the additional backside ILD layer 250' and filling the trenches with conductive material. Trenches are respectively opened in the additional backside ILD layer 250' using, for example, lithography followed by RIE. The conductive wires 265-1 and 265-2, and vias 266-1 and 266-2 are formed in the trenches by filling the trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

The conductive wire 265-1 and via 266-1 deliver, for example, a supply or drain voltage (Vdd) to source/drain region 230-1 (e.g., an input source/drain region) through backside source/drain contact 260-1. The conductive wire 265-2 and via 266-2 deliver, for example, a core supply voltage (Vdd_core) to source/drain region 230-2 (e.g., an output source/drain region) through backside source/drain contact 260-2.

As can be seen in FIGS. 30A-30C, the backside source/drain contact 260-1 contacts the source/drain region 230-1, and the via 266-1 is formed on and contacts the backside source/drain contact 260-1. The backside source/drain contact 260-2 contacts the source/drain region 230-2, and the via 266-1 is formed on and contacts the backside source/drain contact 260-2. The backside ILD layer 250 and the additional backside ILD layer 250' fill in the vacant areas on lateral sides of the backside source/drain contacts 260-1 and 260-2, and on lateral sides of the conductive wires 265-1 and 265-2, and vias 266-1 and 266-2. The backside source/drain contacts 260-1 and 260-2 are adjacent and contact dielectric layers 204. Referring back to FIG. 18, the backside source/drain contacts 260-1 and 260-2 are each self-aligned with multiple edges of the active area (e.g., source/drain regions 230-1 and 230-2.

Figures 31A, 31B, 31C:
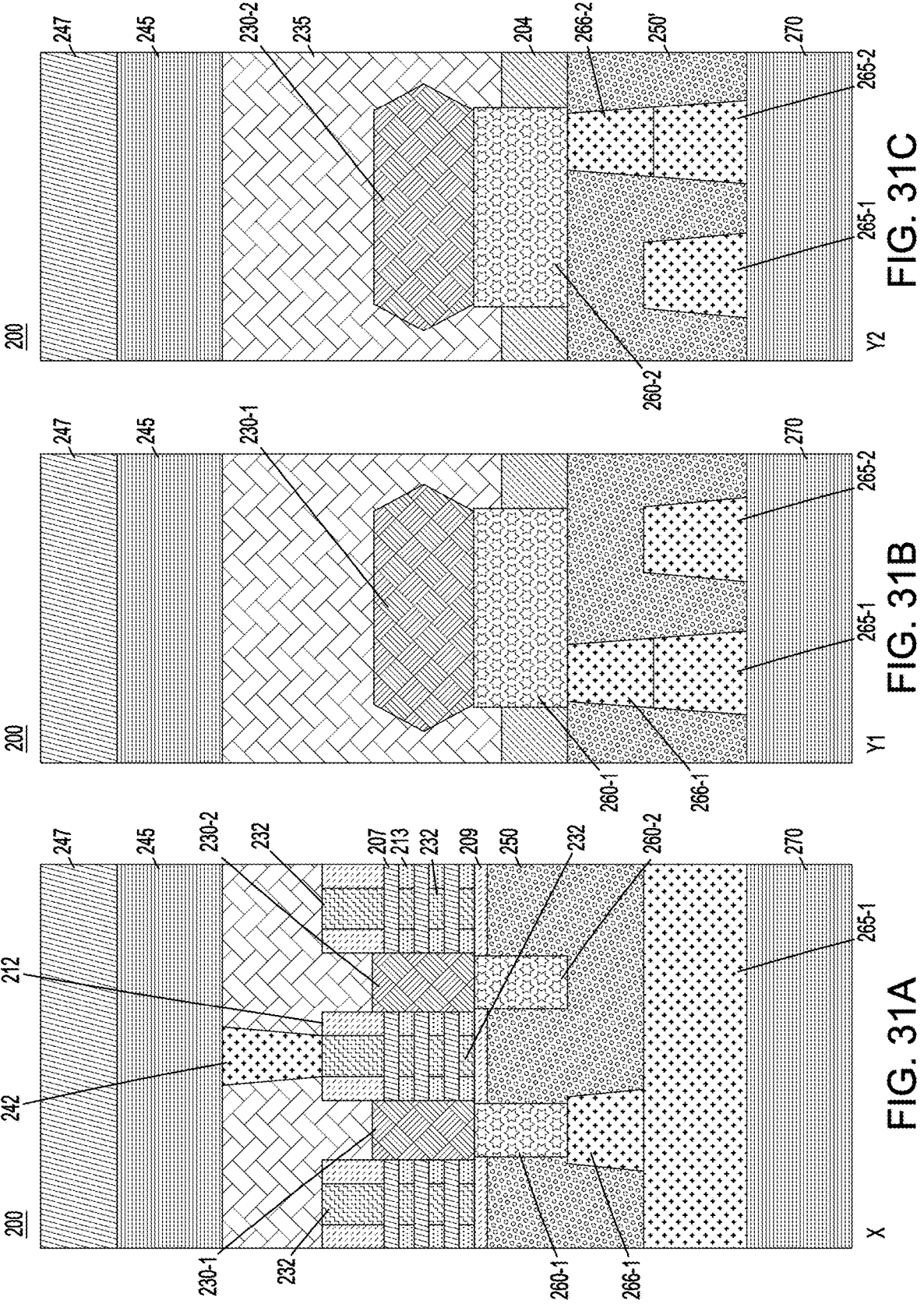
FIG. 31A depicts a first cross-sectional view corresponding to the line X in FIG. 18 following backside interconnect formation, according to an embodiment of the invention.
FIG. 31B depicts a second cross-sectional view corresponding to the line Y1 in FIG. 18 following backside interconnect formation, according to an embodiment of the invention.
FIG. 31C depicts a third cross-sectional view corresponding to the line Y2 in FIG. 18 following backside interconnect formation, according to an embodiment of the invention.

Referring to FIGS. 31A-31C, BSPDN layers 270 (also referred to herein as backside interconnects) are formed on the additional backside ILD layer 250' and on the conductive wires 265-1 and 265-2. The BSPDN layers 270 include various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOS-FETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

As noted above, conventional approaches undesirably employ through vias from the backside to the frontside of a semiconductor device to make connections to source/drain regions of FETs from backside power rails. This results in complex semiconductor manufacturing processes and structures that impede size reductions and miniaturization. The illustrative embodiments advantageously provide techniques for forming efficient connections to backside power sources by using direct backside contacts. For example, input source/drain regions of multiple transistors are commonly connected to a direct backside contact and output source/drain regions of multiple transistors are commonly connected to another direct backside contact. The backside contacts are connected to backside power rails and are self-aligned with edges of the input and output source/drain regions. The transistors may comprise common gate structures, and have the same doping type. In some embodiments, a backside source/drain contact may be formed on part of a surface or an entire surface of a source/drain region. In the case where the backside source/drain contact is formed on an entire surface of a source/drain region, a via may be formed between the backside source/drain contact and a backside power rail.

The semiconductor structure may further comprise at least one gate structure common to the first transistor and the second transistor. The first transistor and the second transistor may have the same doping type. The semiconductor structure may further comprise a third transistor adjacent the second transistor. The third transistor may have a different doping type than that of the first transistor and the second transistor.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first transistor, wherein the first transistor comprises a first input source/drain region and a first output source/drain region;
a second transistor, wherein the second transistor comprises a second input source/drain region and a second output source/drain region;
a first source/drain contact commonly connected to the first input source/drain region and the second input source/drain region;
a second source/drain contact commonly connected to the first output source/drain region and the second output source/drain region;
a third source/drain contact connecting the first input source/drain region and the second input source/drain region to a first power rail; and
a fourth source/drain contact connecting the first output source/drain region and the second output source/drain region to second power rail;
wherein the first source/drain contact and the second source/drain contact are on a first side of the semiconductor structure; and
wherein the third source/drain contact and the fourth source/drain contact are on a second side of the semiconductor structure, opposite the first side.

2. The semiconductor structure of claim 1, wherein:
the first side of the semiconductor structure comprises a frontside of the semiconductor structure; and
the second side of the semiconductor structure comprises a backside of the semiconductor structure.

3. The semiconductor structure of claim 2, wherein at least one edge of the first source/drain contact is self-aligned with at least one edge of the first input source/drain region.

4. The semiconductor structure of claim 3, wherein at least one edge of the second source/drain contact is self-aligned with at least one edge of the second output source/drain region.

5. The semiconductor structure of claim 1, further comprising at least one gate structure common to the first transistor and the second transistor.

6. The semiconductor structure of claim 1, wherein the first transistor and the second transistor have a same doping type.

7. The semiconductor structure of claim 6, further comprising a third transistor adjacent the second transistor, wherein the third transistor has a different doping type than that of the first transistor and the second transistor.

8. The semiconductor structure of claim 1, wherein the first transistor and the second transistor are nanosheet transistors.

9. A semiconductor structure comprising:
a plurality of input source/drain regions connected to a first wire through a first contact; and
a plurality of output source/drain regions connected to a second wire through a second contact;
wherein the first wire and the second wire are on a same side of the semiconductor structure; and
wherein the plurality of input source/drain regions and the plurality of output source/drain regions correspond to a merged transistor, wherein the merged transistor comprises a first transistor and a second transistor.

10. The semiconductor structure of claim 9, wherein the same side of the semiconductor structure comprises a backside of the first transistor and of the second transistor.

11. The semiconductor structure of claim 9, further comprising a third transistor adjacent the merged transistor and at least one gate structure common to the merged transistor and the third transistor, wherein:
the first transistor and the second transistor have a same doping type; and
the third transistor has a different doping type than that of the first transistor and the second transistor.

12. The semiconductor structure of claim 9, wherein the first transistor and the second transistor are nanosheet transistors.

13. The semiconductor structure of claim 9, wherein:
the first wire comprises a first power rail; and
the second wire comprises a second power rail.

14. A semiconductor structure comprising:
a plurality of transistors comprising a first transistor, a second transistor adjacent the first transistor and a third transistor adjacent the second transistor, wherein the first transistor and the second transistor have a same doping type, and the third transistor has a different doping type than that of the first transistor and the second transistor;
at least one gate structure common to the first transistor, the second transistor and the third transistor;
a first input source/drain region and a first output source/drain region corresponding to the first transistor; and
a second input source/drain region and a second output source/drain region corresponding to the second transistor;
wherein the first input source/drain region and the second input source/drain region are connected to a first source/drain contact; and
wherein the first output source/drain region and the second output source/drain region are connected to a second source/drain contact.

15. The semiconductor structure of claim 14, wherein:
at least one edge of the first source/drain contact is self-aligned with at least one edge of the first input source/drain region; and
at least one edge of the second source/drain contact is self-aligned with at least one edge of the second output source/drain region.

16. The semiconductor structure of claim 14, wherein the first source/drain contact and the second source/drain contact are disposed on a backside of the plurality of transistors and are respectively connected to a first wire and a second wire disposed on the backside of the plurality of transistors.

17. The semiconductor structure of claim 16, wherein the first wire contacts the first source/drain contact, and the second wire contacts the second source/drain contact.

18. The semiconductor structure of claim 14, wherein the plurality of transistors comprises a plurality of nanosheet transistors.

* * * * *